United States Patent

Nishi

[11] Patent Number: 6,115,107
[45] Date of Patent: Sep. 5, 2000

[54] EXPOSURE APPARATUS

[75] Inventor: Kenji Nishi, Yokohama, Japan

[73] Assignee: Nikon Corporation, Tokyo, Japan

[21] Appl. No.: 08/932,998

[22] Filed: Sep. 18, 1997

[30] Foreign Application Priority Data

Sep. 18, 1996 [JP] Japan .................................. 8-245809

[51] Int. Cl.[7] .......................... G03B 27/74; G03B 27/72; G03B 27/42
[52] U.S. Cl. .................................. 355/68; 355/53; 355/67
[58] Field of Search ................... 355/53, 67, 68, 355/69, 70, 71; 356/243, 218

[56] References Cited

U.S. PATENT DOCUMENTS

| | | | |
|---|---|---|---|
| 4,443,117 | 4/1984 | Muramoto et al. | 374/1 |
| 4,465,368 | 8/1984 | Matsuura et al. | 356/218 |
| 4,927,266 | 5/1990 | Sugiura et al. | |
| 5,581,324 | 12/1996 | Miyai et al. | 355/53 |
| 5,892,573 | 4/1999 | Takahashi et al. | 355/69 |
| 5,894,341 | 4/1999 | Nishi et al. | 355/68 |
| 5,914,773 | 6/1999 | Kurosawa et al. | 355/53 |

FOREIGN PATENT DOCUMENTS

| | | |
|---|---|---|
| 57-059115 | 4/1982 | Japan . |
| 60-52852 | 3/1985 | Japan . |
| 60-188950 | 9/1985 | Japan . |
| 07087262 | 3/1995 | Japan . |
| 7-087262 | 3/1995 | Japan . |

Primary Examiner—Alan A. Mathews
Attorney, Agent, or Firm—Morgan, Lewis & Bockius LLP

[57] ABSTRACT

An exposure apparatus with detachable illumination sensor, which is used to calibrate permanently installed illumination sensors such as an integrator sensor that detects the intensity of exposing light IL split by a beam splitter inside the illumination system and a fixed-type illumination sensor 7, which is fastened to the surface of the wafer stage 1. The detachable illumination sensor is installed on the wafer stage 1 in a freely detachable manner and the output signal from this detachable illumination sensor is forwarded to an illumination control unit via a sensor control device. In the calibration of the integrator sensor, the intensity of the exposing light IL is synchronously measured by the integrator sensor and the detachable illumination meter and the output signals from these sensors are processed inside the illumination control unit.

55 Claims, 12 Drawing Sheets

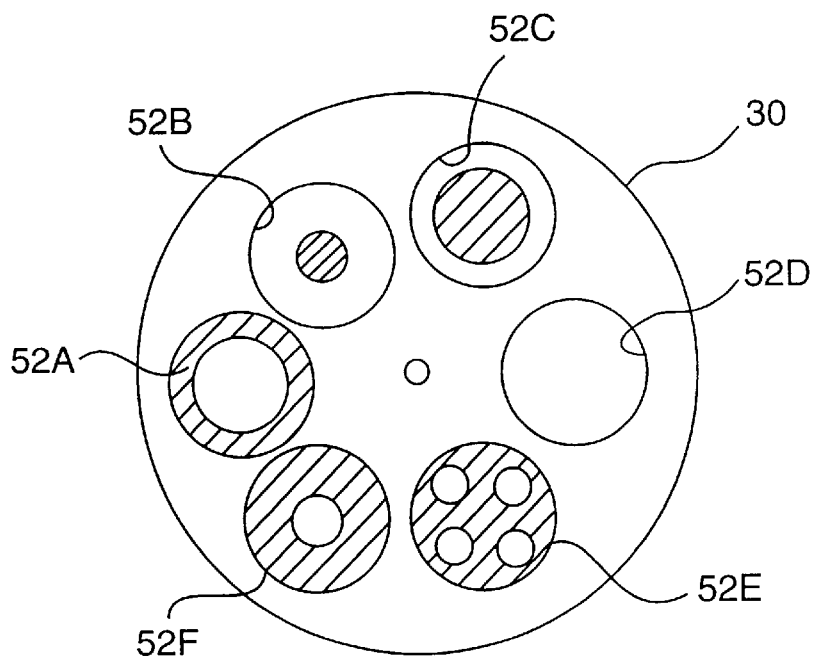
FIG. 6(a)
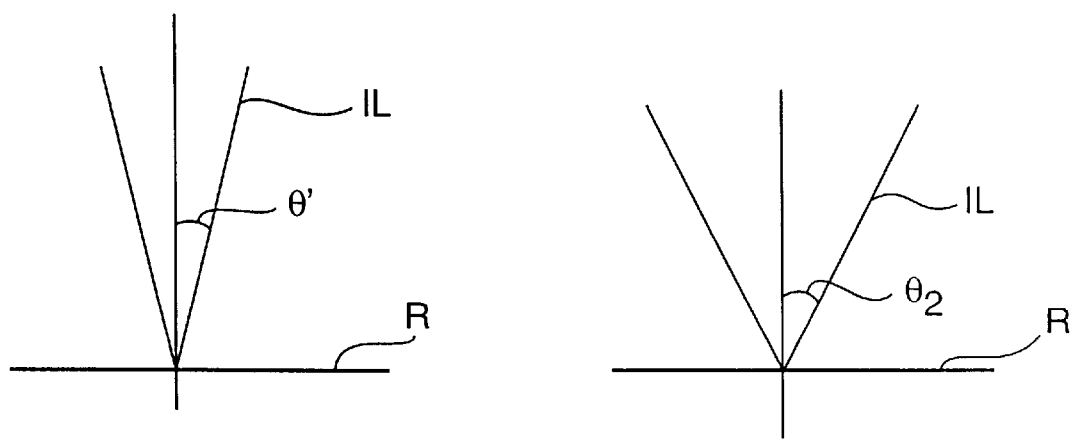
FIG. 6(b)    FIG. 6(c)

EXPOSURE APPARATUS

This application claims the benefit of Japanese Patent Application No. 08-245809 filed Sep. 18, 1996, which is hereby incorporated by reference.

BACKGROUND OF THE INVENTION

1. Field of the Invention

The present invention relates to an exposure apparatus which is used to expose a mask pattern on a photosensitive substrate in photolithographic processes used to manufacture (for example) semiconductor elements, liquid crystal display elements, imaging elements (CCD's, etc.) or thin-film magnetic heads. More specifically, the present invention concerns an exposure apparatus that calibrates a permanently installed illumination sensor, which is used for the direct or indirect measurement of the intensity of illumination of the exposing light on the stage on which the photosensitive substrate is placed.

2. Discussion of the Related Art

Conventional exposure apparatus, such as a one-shot exposure apparatus (steppers, etc.) in which a pattern on a reticle (or photo-mask, etc.) is used as a mask, is transferred via a optical projection system onto a wafer (or glass plate, etc.), which is coated with photoresist as the photosensitive substrate. Alternatively, a proximity type exposure apparatus, in which a reticle pattern is transferred directly onto the wafer without using a optical projection system has been used in order to manufacture semiconductor elements, and the like. Recently, scan exposure type projection exposure apparatus, such as step-and-scan systems, are employed in which a reticle pattern is successively transferred onto respective shot areas on a wafer by synchronously scanning the reticle and wafer with respect to the optical projection system. The step-and-scan systems have also been used in order to achieve a substantial increase in the exposure area without increasing the size of the optical projection system.

The amount of exposure that is generally appropriate for the photoresist on the wafer is set. Accordingly, such an exposure apparatus is equipped with an illumination sensor which is used to measure the intensity of the exposing light on the wafer, either directly or indirectly, and the amount of exposure on the wafer is controlled on the basis of the values measured by this illumination sensor.

FIG. 12 depicts a projection exposure apparatus equipped with a conventional illumination sensor. In FIG. 12, exposing light IL emitted by an exposure light source 109 illuminates the pattern area of a reticle R via an illumination system 103, and an image of the pattern on the reticle R is transferred onto each shot area of the wafer W (which is coated with a photoresist) in the presence of the exposing light IL via a optical projection system 102. The wafer W is held on a wafer stage 101, which is used to three dimensional position the wafer.

Furthermore, the illumination system 103 is equipped with a fly-eye lens, a beam splitter 111, which separates a portion of the exposing light emitted from the fly-eye lens, and a condenser lens. The exposing light IL separated by the beam splitter 111 enters an integrator sensor 110, which is used as an illumination sensor (consisting of a photoelectric detector), and the output signal of the integrator sensor 110 is sent to an illumination control unit 105. This illumination control unit 105 is connected to a main controller 107, which controls the operation of the apparatus as a whole, and the main controller 107 is connected to a console 112 which consists of an input device and a display.

The beam splitter 111 has a fixed reflectivity, so that the amount of light which passes through the beam splitter 111 and is directed onto the wafer W can be calculated from the intensity of illumination detected by the integrator sensor 110. In actuality, however, it is necessary to consider this amount of light in accordance with the reflection and absorption occurring in the reticle R and optical projection system 102. Accordingly, as will be described later, the value of the ratio of the output of the integrator sensor 110 to the output of an illumination meter installed on the wafer stage 101 is determined beforehand and stored in the main controller 107. At the time of exposure, the main controller 107 determines the intensity of the exposing light on the wafer W from the value of the above-mentioned ratio and the output value of the integrator sensor 110, and controls the amount of exposing light directed onto the wafer W in accordance with this intensity.

Furthermore, an illumination sensor 104 consisting of a permanently installed photoelectric detector, which is exclusively for use in this apparatus, is fastened to the wafer stage 101 in the vicinity of the wafer W, and the output signal of this illumination sensor 104 is sent to the illumination control unit 105 via a signal cable 106. Then, prior to exposure, the light-receiving part of the illumination sensor 104 is set inside the exposure field of the optical projection system 102, and is moved if necessary so that the intensity of the exposing light on the surface of the wafer stage 101, and any irregularity in this intensity, can be measured.

In this case, since numerous exposure apparatus are installed in a semiconductor elements manufacturing line it is necessary to match the amount of exposure applied to the wafers by the respective exposure apparatus. In order to accomplish such matching, it is necessary to calibrate the outputs of the integrator sensors 110 and illumination sensors 104 installed in respective exposure apparatus with respect to the quantity of incident light (i.e., it is necessary to calibrate the sensitivities of the respective sensors). Specifically, the amount of exposure that is appropriate for the photoresist is determined as follows: wafers exposed under a certain intensity of illumination with the actual exposure time varied are developed, and the appropriate amount of exposure is determined from the exposure time of the image with the highest resolution among the exposed images and the intensity of illumination.

Accordingly, if the sensitivities of the sensors in the respective exposure apparatus are different, the appropriate amount of exposure determined for each exposure apparatus will differ according to these differences in sensitivity. Conventionally, a detachable illumination meter 108, which acts as a reference, has been used to calibrate the sensitivities of the integrator sensors 110 and illumination sensors 104.

In order to allow matching with other exposure apparatus, the illumination meter 108 is constructed so that it is freely detachable from the wafer stage 101 and can be moved over the surface of the wafer stage 101. The output signal of the illumination meter 108 is sent to a display 113 via a signal cable 114, and the value measured by the illumination meter 108 is displayed on the display 113. In this case, the display 113 is installed outside the chamber in which the projection exposure apparatus, shown in FIG. 12, is accommodated so that the display content can easily be seen by the operator. Thus, since the illumination meter 108 is freely detachable from the wafer stage 101, the sensitivities of the integrator sensor 110 and illumination sensor 104 can be calibrated as described below using the illumination meter 108. As a result, when a prescribed amount of exposure (dose) is applied to the photoresist on the wafer, in an arbitrarily selected exposure apparatus, the same amount of exposure can also be applied in the other exposure apparatus.

In cases where sensitivity calibration is performed for the integrator sensor 110. The illumination sensor 104 in the projection exposure apparatus, shown in FIG. 12, the illumination meter 108 is attached in a prescribed position on the wafer stage 101, and this illumination meter 108 is moved to the vicinity of the center of the exposure field of the optical projection system 102, after which the exposure light source 109 is lit by a command from the main controller 107, and the intensity of illumination on the surface of the wafer stage 101 is measured by the illumination meter 108. The output value IA of this illumination meter 108 is displayed by the display 113 and is recorded by the operator.

Next, the permanently installed illumination sensor 104, which is fastened to the surface of the wafer stage 101, is moved to the vicinity of the center of the exposure field of the optical projection system 102, and the intensity of illumination is measured. The output value IB of the illumination sensor 104 is subjected to analog/digital (A/D) conversion in the illumination control unit 105, and the measurement data following this A/D conversion is sent to the main controller 107. In parallel with this, the output value IC of the permanently installed integrator sensor 110 is also sampled by the illumination control unit 105, and this sampled output is sent to the main controller 107. The output value IB of the illumination sensor 104 and output value IC of the integrator sensor 110, thus sent to the main controller 107, are sent from the main controller 107 to the console 112, and these output values IB and IC are displayed on the display of the console 112.

From the display the operator determines the value $k_{AC}$ of the ratio of the output value IA of the illumination meter 108 to the output value IC of the integrator sensor 110 (=IA/IC), with the output of the exposure light source 109 assumed to be constant. The value $k_{AC}$ of this ratio is a parameter which is used for the calibration of the integrator sensor 110. Specifically, the actual intensity of illumination on the wafer W (corresponding to the intensity of illumination in the other exposure apparatus) can be calculated by multiplying the output value of the integrator sensor 110 during exposure by the parameter $k_{AC}$. Furthermore, the value $k_{AB}$ of the ratio of the output value IA of the illumination meter 108 to the output value IB of the illumination sensor 104 is a parameter which is used for the calibration of the illumination sensor 104. Specifically, the intensity of illumination corresponding to the intensity of illumination in the other exposure apparatus can be calculated by multiplying the output value of the illumination sensor 104 by the parameter $k_{AB}$.

The timing with which the output value of the illumination meter 108 (which acts as a reference) is read from the display 113 differs from the timing with which the output values of the illumination sensor 104 and integrator sensor 110 are measured via the console 112. Accordingly, if there is a variation in the output of the exposure light source 109 over time, the parameters $k_{AC}$ and $k_{AB}$ measured will fluctuate. Conventionally, the effect of this fluctuation has been alleviated by measuring the output values IA, IB, and IC of the illumination meter 108 over a long period of time and averaging these values, or by calculating the parameters $k_{AC}$ and $k_{AB}$ by respectively determining peak hold values obtained in multiple measurements of the output values IA, IB, and IC. In these methods, however, there is no reduction of the discrepancy between the timing of the measurement of the output value IA and the timing of the measurement of the output values IB and IC. Accordingly, the measurement precision of the parameters obtained cannot be greatly increased.

Furthermore, since the display 113, which displays the output value IA of the illumination meter 108 (which acts as a reference) and the console 112, which displays the output values of the illumination sensor 104 and integrator sensor 110 are separated from each other and independently controlled, the measurement results cannot be simultaneously processed. Thus, the calculation of the parameters $k_{AC}$ and $k_{AB}$ occur at different points in time.

Moreover, when numerous exposure apparatus are used in a series, there may be instances in which a plurality of illumination meters 108 acting as references are provided, and the permanently installed illumination sensors of the apparatus are calibrated using these illumination meters 108. In such cases, if the matching precision of the outputs of the respective illumination meters 108 is poor, the matching precision of the intensity of illumination in the respective exposure apparatus will decline.

SUMMARY OF THE INVENTION

Accordingly, the present invention is directed to an exposure apparatus that substantially obviates one or more of the above problems due to the limitations and disadvantages of the related art.

An object of the present invention is to provide an interface device that inputs measurement data from a detachable illumination sensor, and the relationships of the outputs of permanently installed illumination sensors to the output of this detachable illumination sensor are determined and stored by an exposure amount control means. Since measurement data from both types of illumination sensors are input more or less simultaneously by the interface device, the ratios of the outputs of both types of illumination sensors can be accurately determined even if there are fluctuations in the output of the exposure light source over time due to arc fluctuations or variations in the pulse energy. Accordingly, the permanently installed illumination sensors can be calibrated with a high degree of precision.

In this embodiment, since measurement data from both types of illumination sensors are processed in common by the exposure amount control means, such measurement data can be processed at a high speed. Furthermore, there are no input errors caused by the human agency of the operator.

Another object of the present invention is to increase the precision with which the permanently installed sensor is calibrated when there are fluctuations in the output of the exposure light source. Measurement data from the two types of illumination sensors are input with the same timing. The permanently installed illumination sensor is an indirect type illumination sensor (e.g., an integrator sensor) which indirectly measures the intensity of the illuminating light on the substrate stage by detecting the intensity of a light beam separated from the illuminating light. The exposure amount control means then inputs measurement data from this permanently installed illumination sensor in synchronization with the input of measurement data from the detachable illumination sensor via the interface device.

A further object of the present invention is to provide an exposure apparatus wherein the illuminating light used for exposure is illuminating light emitted in the form of pulses. The exposure amount control means inputs measurement data from the detachable illumination sensor via the interface device in synchronization with the pulsed emission of the illuminating light used for exposure. The intensity of the illuminating light produced by this pulsed emission can be synchronously measured on-line. Therefore, the intensity of illumination can be accurately measured without any discrepancy in the measurement timing of the detachable illumination sensor and permanently installed illumination sensors, so that the outputs of the permanently installed illumination sensors can be calibrated with a high degree of precision.

An additional object of the invention is to provide an exposure apparatus wherein the interface device sends measurement data from the detachable illumination sensor to the exposure amount control means via a cordless system. Thus, the work involved in the attachment and detachment of the detachable illumination sensor on the substrate stage is facilitated.

A still further object of the present invention is to provide a second embodiment to accommodate cases where illumination intensity calibration is performed for numerous exposure apparatus. In this embodiment a second detachable illumination sensor is used as a parent device while the first detachable illumination sensor is used as a child device, thus allowing calibration of the output of the child device with a high degree of precision. Accordingly, the precision of intensity matching among a large number of exposure apparatus can be improved. Additionally, by installing a plurality of child devices for one parent device and a plurality of grandchild devices for each of these child devices, it is possible to improve the precision of intensity matching among an even larger number of exposure apparatus. If a detachable illumination sensor should malfunction, this sensor can be replaced by other detachable illumination sensors.

The final object of the present invention is to provide a third embodiment to improve the matching precision among respective exposure apparatus. In this embodiment the intensity of the illuminating light, split by means of a splitting optical system on the substrate stage is measured by the first and second detachable illumination sensors so that the first detachable illumination sensor can be calibrated. Accordingly, the first illumination sensor can be calibrated with a high degree of precision without being affected by fluctuations in the illuminating light or by the intermediate optical system. Therefore, the matching precision among respective exposure apparatus is improved.

BRIEF DESCRIPTION OF THE DRAWINGS

The accompanying drawings, which are included to provide a further understanding of the invention are incorporated in and constitute a part of this specification, illustrate embodiments of the invention and together with the description serve to explain the principles of the invention. In the drawings:

FIG. 6(a) is a plan view showing examples of the aperture diaphragms installed at the emission surface of the fly-eye lens inside the illumination system 17 of the projection exposure apparatus shown in FIG. 4.

FIG. 6(b) illustrates the incidence of exposing light with a small aperture angle on the reticle R.

FIG. 6(c) illustrates the incidence of exposing light with a large aperture angle on the reticle R.

DETAILED DESCRIPTION OF THE PREFERRED EMBODIMENTS

Figure 1:
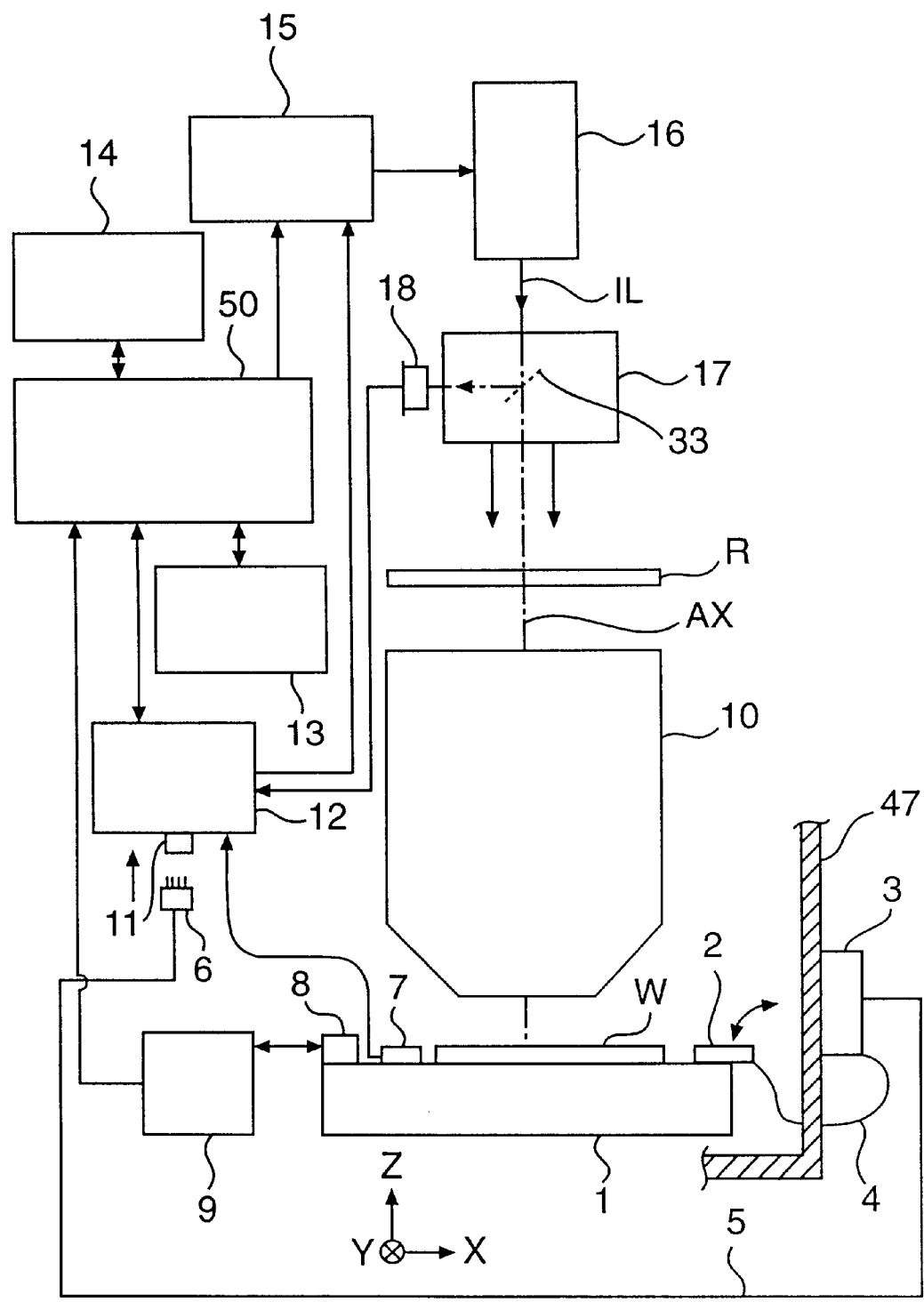
FIG. 1 is a schematic structural diagram which illustrates a first embodiment of the exposure apparatus of the present invention.

As is shown in FIG. 1, the first exposure apparatus of the present invention is characterized by an exposure apparatus, having a substrate stage 1 that supports and positions a photosensitive substrate W. The apparatus transfers a pattern, formed on a mask R, onto the photosensitive substrate W. So that the pattern is exposed in the presence of illuminating light IL. The exposure apparatus has a detachable illumination sensor 2, which can be freely attached to or detached from the substrate stage 1, which directly measures the intensity of illumination of the illuminating light IL on the substrate stage 1. The exposure apparatus has permanently installed illumination sensors 7, 18, which directly or indirectly measure the intensity of illumination of the illuminating light IL on the substrate stage 1; an interface devices 3–6, 11 which inputs measurement data from the detachable illumination sensor 2; and an exposure amount control means 12, 50 which determines and stores the relationship between the measurement data from the detachable illumination sensor 2 that is input via the interface device and measurement data from the permanently installed illumination sensors 7, 18.

In this first exposure apparatus of the present invention, direct measurement data from the detachable illumination sensor 2 is input via the interface devices 3–6, 11, and measurement data from the permanently installed illumination sensors 7, 18 is input substantially simultaneously. The relationship between the measurement data from the detachable illumination sensor 2 and the measurement data from the permanently installed illumination sensors 7, 18 is then determined, i.e., the ratios of the measurement data or offset values are determined. This means that the measurement data from the permanently installed illumination sensors 7, 18 is calibrated. In this case, since the measurement data from the detachable illumination sensor 2 and the measurement data from the permanently installed illumination sensors 7, 18 are input substantially simultaneously, the relationship of the measurement data from the two types of illumination sensors can be accurately determined even if there are fluctuations in the output of the light source (which provides the illuminating light IL used for exposure) over time. Fluctuations in output can be caused by oscillation of the arc of a mercury lamp or variation in the pulse energy of an excimer laser light source, or the like. Accordingly, the permanently installed illumination sensors 7, 18 can be calibrated with a high degree of precision.

Furthermore, the measurement data from the two types of sensors is input into a common exposure amount control means 12, 50, and is processed on-line at a high speed. Therefore, the calibration of the permanently installed illumination sensors 7, 18 can be performed at a high speed and at greater accuracy than can be performed by a human operator.

One example of the permanently installed illumination sensors is the illumination sensor 18, which measures the intensity of the illuminating light IL on the substrate stage 1, indirectly by detecting the intensity of a light beam which is separated from the illuminating light IL. It is desirable that the exposure amount control means 12, 50 input measurement data from the permanently installed illumination sensor 18 is in synchronization with the input of measurement data from the detachable illumination sensor 2 via the interface devices 3–6, 11. The "indirect illumination sensor 18" refers to an integrator sensor which detects the intensity of a light beam which is split from the illuminating light IL. By inputting the measurement data from this integrator sensor and the detachable illumination sensor 2 in synchronization, it is possible to eliminate the effect of variations in the output of the exposure light source over time, so that calibration of the integrator sensor can be performed with a high degree of precision.

Furthermore, in cases where the illuminating light IL used for exposure is an illuminating light which is emitted in the form of pulses, it is desirable that the exposure amount control means 12, 50 input measurement data from the detachable illumination sensor 2 via the interface devices 3–6, 11 in synchronization with the pulsed emission of the illuminating light IL used for exposure. As a result, there is no discrepancy in the measurement timing of the two types of illumination sensors. Thus, even if there is some variation in the pulsed energy, the calibration of the permanently installed sensors 7, 18 with respect to the detachable illumination sensor 2 can be performed with a high degree of precision.

Figure 2A:
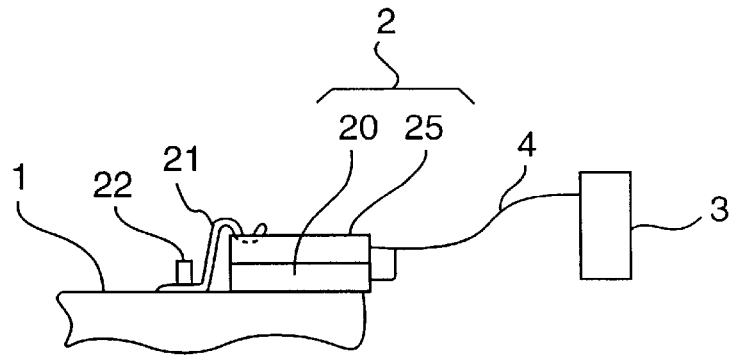
FIG. 2(a) is an enlarged view which illustrates the conditions of attachment of the detachable illumination meter 2 (shown in FIG. 1) to the wafer stage 1.
Figure 2B:
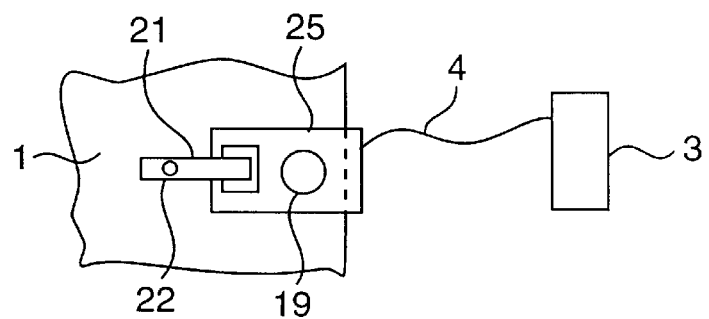
FIG. 2(b) is a plan view of FIG. 2(a)
Figure 2C:
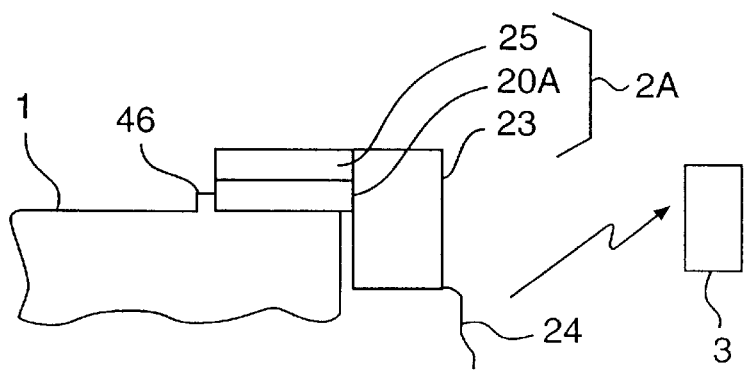
FIG. 2(c) is an enlarged view which shows a cordless type detachable illumination meter 2.

For example, as is shown in FIGS. 1 and 2(c), the interface devices 3, 5, 6, 11 may be arranged so that measurement data from the detachable sensor 2A is supplied to the exposure amount control means 12, 50 via a cordless system. Ordinarily, the exposure apparatus is accommodated inside a chamber in which the temperature is controlled. If a cordless system is used, there is no need for wiring passing through the walls of the chamber. Therefore, the handling of the detachable illumination sensor 2A is facilitated.

As is shown in FIGS. 1, 2, and 10, the second exposure apparatus of the present invention is characterized by an exposure apparatus which has a substrate stage 1 that positions a photosensitive substrate W, transfers a pattern formed on a mask R onto the photosensitive substrate W on the substrate stage 1, and exposes this pattern in the presence of illuminating light IL. The exposure apparatus has permanently installed illumination sensors 7, 18, which directly or indirectly measure the intensity of illumination of the illuminating light IL on the substrate stage 1. A first detachable illumination sensor 2, which can be freely attached to or detached from the substrate stage 1, directly measures the intensity of illumination of the illuminating light IL on the substrate stage 1 in order to calibrate the output of the permanently installed illumination sensors 7, 18. A memory means 25 then stores the correction values (including the values of ratios, etc.) for the output of the first detachable illumination sensor 2 relative to the output of a second detachable illumination sensor A1, which acts as a prescribed reference.

In this second exposure apparatus of the present invention, the second detachable illumination sensor A1 acts as a parent device, with respect to the first illumination sensor 2, and the absolute intensity of illumination is controlled in stages arranged as parent, child, and grandchild devices. For example, in cases where numerous exposure apparatus are arranged in a series, numerous detachable illumination sensors 2 (acting as references) are required. Here, when the linearity of the output of the parent device A1, with respect to the amount of incident light, is used as a reference for the absolute intensity of illumination, the precise matching of the measured intensity values among the numerous exposure apparatus is improved by correcting the outputs of the child devices 2 by a correction value from the output of the parent device.

As is shown in FIGS. 1 and 11, the third exposure apparatus of the present invention is characterized by an exposure apparatus, which has a substrate stage 1 that positions a photosensitive substrate W, transfers a pattern formed on a mask R onto the photosensitive substrate W, and exposes this pattern in the presence of illuminating light IL used for exposure. The exposure apparatus has permanently installed illumination sensors 7, 18, which directly or indirectly, measure the intensity of illumination of the illuminating light IL on the substrate stage 1. A first detachable illumination sensor 2, which can be freely attached to or detached from the substrate stage 1 directly measures the intensity of illumination of the illuminating light IL on the substrate stage 1 in order to calibrate the output of the permanently installed illumination sensors 7, 18. A second detachable illumination sensor A1 acts as a reference for the output of the first detachable illumination sensor and an optical splitting system 61, 62, 63A, 63B, which splits the illuminating light IL used for exposure on the substrate stage 1 and conducts the split light to the first and second detachable illumination sensors 2, A1. A signal processing device 59 then inputs the outputs of the first and second detachable illumination sensors 2, A1 in parallel, and compares these outputs.

In this third exposure apparatus of the present invention, the intensity of the illuminating light IL, which is split by the optical splitting system, is measured on the substrate stage 1 by the first and second detachable illumination sensors 2, A1, thus allowing calibration of the first detachable illumination sensor 2. Accordingly, the first detachable illumination sensor 2 can be calibrated with a high degree of precision, without being affected by the intermediate optical system or fluctuations in the illuminating light. Specifically, the illumination sensor 2 is calibrated as a child device, with respect to the illumination sensor A1, which acts as a parent device. Thus, the permanently installed illumination sensors 7, 18 can be calibrated with a high degree of precision using the first detachable illumination sensor 2, which has been calibrated with a high degree of precision. This configuration results in improved precision matching of the illumination intensity among the respective exposure apparatus.

A first embodiment of the exposure apparatus of the present invention will now be described with reference to FIGS. 1 through 7. The present invention can be applied to either stepper-type or step-and-scan type exposure apparatus. In the embodiment described below, the present invention is applied to a stepper-type projection exposure apparatus.

FIG. 1 illustrates the schematic construction of the projection exposure apparatus of this embodiment. During exposure the exposing light IL, to which the photoresist on the wafer is sensitive, is emitted from a light source part 16 that includes a shutter and an exposure light source consisting of a mercury lamp, and the like. The opening and closing of the shutter inside the light source part 16 is controlled via a light source control unit 15 by a main controller 50, which performs overall control of the entire apparatus. The output of the exposure light source inside the light source part 16 is controlled by the light source control unit 15, which controls the amount of exposure for a one (1) exposure by opening and closing of the shutter. A bright line such as the i-line (wavelength: 365 nm) or g-line of a mercury lamp is used as the exposing light IL. Alternatively, an ArF excimer laser light source or KrF excimer laser light source, or a harmonic-generating device, such as a copper vapor laser light source or YAG laser may be used. Illuminating light IL emitted from the light source part 16 enters the illumination system 17.

Figure 4:
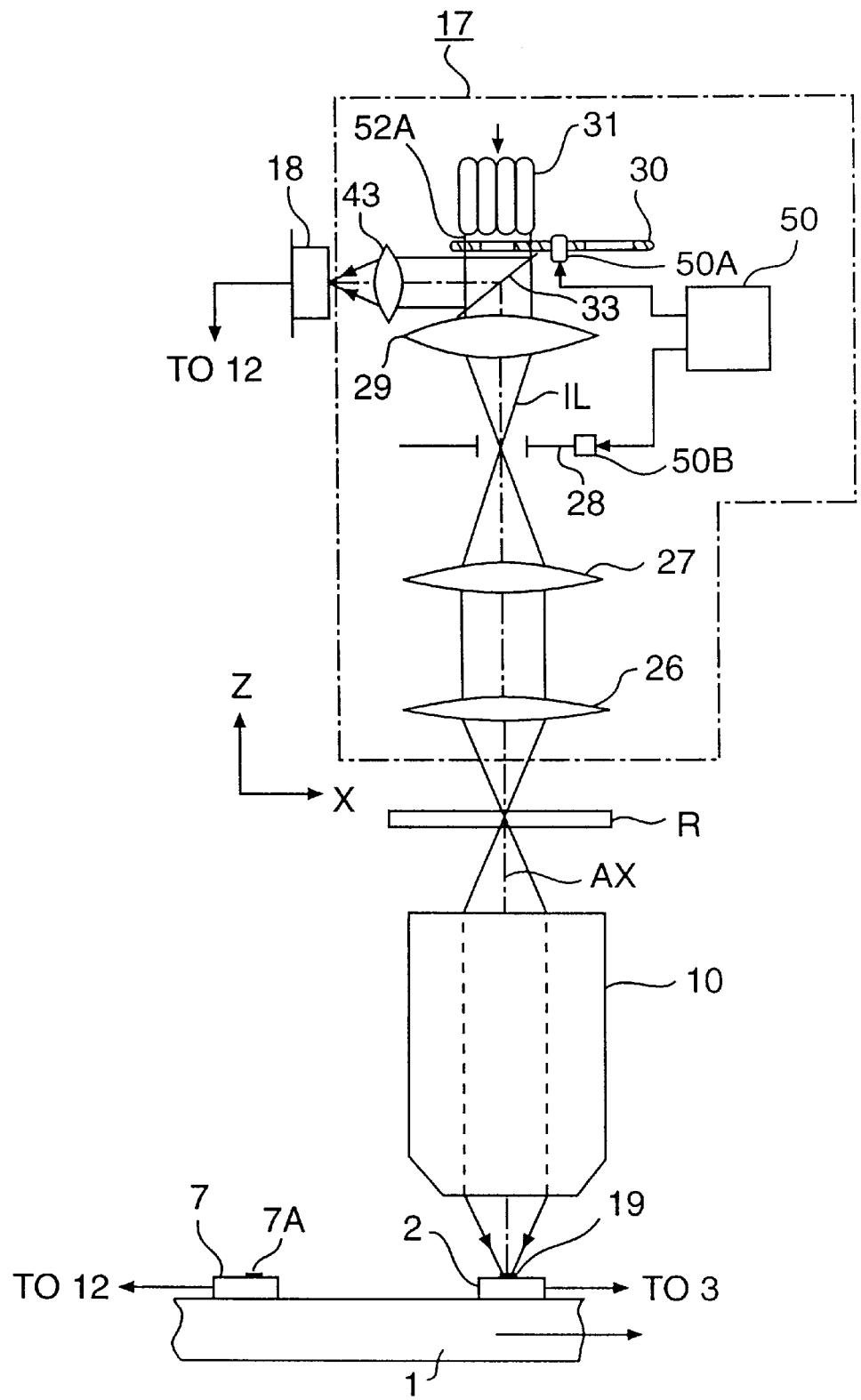
FIG. 4 is a structural diagram which shows the details of the illumination system 17 shown in FIG. 1.

FIG. 4 illustrates the internal construction of the illumination system 17. As is shown in FIG. 4, exposing light IL, which has entered the illumination system 17, enters a fly-eye lens 31 which acts as an optical integrator. Respective secondary light sources are formed at the emission surfaces of the respective lens elements of the fly-eye lens 31, and a planar light source is created by these secondary light sources. A plurality of switchable aperture diaphragms, which are used to adjust the size and shape of the planer light source, are installed at the emission surface of the fly-eye lens 31, i.e., at the pupil plane of the illumination system 17. These aperture diaphragms are fastened to a turret-form disk 30, and this disk 30 is rotated by the main controller 50 via a driving mechanism 50A so that the desired aperture diaphragm is set at the emission surface of the fly-eye lens 31.

FIG. 6(a) illustrates the installation of the aperture diaphragms on the disk 30 in FIG. 4. Six aperture diaphragms 52A through 52F are fastened to the disk 30 at equal angular intervals around the center of the disk 30. This first aperture diaphragm 52A has a circular aperture which is used in cases where illumination is performed with an intermediate coherence factor (a value). The second aperture diaphragm 52B and third aperture diaphragm 52C, respectively, have an annular band aperture, in which the central portion is blocked, and an aperture used for ordinary annular band illumination. Furthermore, the fourth aperture diaphragm 52D, which has a circular aperture, is used in cases where ordinary illumination is performed. The fifth aperture diaphragm 52E is an aperture diaphragm, having four small circular apertures formed around the periphery, and is used for so-called "modified illumination." The sixth aperture diaphragm 52F has a small circular aperture used when where illumination is performed with a small σ value.

Returning to FIG. 4, the first aperture diaphragm 52A is positioned at the emission surface of the fly-eye lens 31. The exposing light IL, which has passed through the first aperture diaphragm 52A, enters a beam splitter 33. The beam splitter 33 allows almost all of the incident light beam to pass through, and reflects the remainder. A light beam constituting a fixed proportion of the exposing light IL is reflected in a direction which is substantially perpendicular to the incident light path of the exposing light IL. This reflected light beam passes through a collecting lens 43 and enters an integrator sensor 18 consisting of a photodiode.

Meanwhile, the exposing light IL, which has passed through the beam splitter 33, passes through a first relay lens 29 and is focused on the aperture of a variable-field diaphragm (reticle blind) 28. The illumination range of the exposing light IL on the reticle is regulated by the variable-field diaphragm 28. The shape and size of the aperture of the variable-field diaphragm 28 are set by the main controller 50 via a driving mechanism 50B. The exposing light IL passing through the variable-field diaphragm 28 is directed onto the pattern area of the reticle R via a second relay lens 27 and condenser lens 26.

Returning to FIG. 1, an image of the pattern on the reticle R is transferred onto the photoresist layer in each shot area on the wafer W at a projection magnification of β (for example, β is ¼ or ⅕) via an optical projection system 10 in the presence of the exposing light IL. In the following description, the Z-axis will be taken in the direction parallel to the optical-axis AX of the optical projection system 10. The X-axis will be taken in the direction parallel to the plane of the page in FIG. 1 within the plane perpendicular to the Z-axis, and the Y-axis will be taken in the direction perpendicular to the plane of the page in FIG. 1 within the plane perpendicular to the Z-axis. In this case, the photoelectric signal from the integrator sensor 18, which receives the light beam from the illumination system 17, is sent to an illumination control unit 12. In the illumination control unit 12, the signal undergoes analog/digital (A/D) conversion.

On the basis of this A/D-converted digital data, information concerning the current intensity of the exposing light IL is sent directly from the illumination control unit 12 to the main controller 50 and light source control unit 15. The light source control unit 15 then controls the output of the exposure light source inside the light source part 16 so that the illumination intensity thus sent is maintained at a preset intensity. The relationship between the output of the integrator sensor 18 and the intensity of the exposing light on the wafer W is stored beforehand in the main controller 50 and the intensity of illumination on the wafer W is calculated from this relationship. The opening and closing action of the shutter, inside the light source part 16, is controlled via the light source control unit 15 so that the integrated value of this calculated intensity is maintained at the appropriate integrated amount of exposure for the photoresist on the wafer W.

When the exposure light source is a pulsed light source, such as an excimer laser light source, and the apparatus is a one-time exposure type apparatus, such as a stepper, control of the integrated amount of exposure is accomplished by controlling the opening and closing of the shutter inside the light source part 16, controlling a light-reduction mechanism installed inside the light source part 16, or controlling the variable light quantity system (variable power supply) of the laser light source itself.

When the exposure light source is a pulsed light source and the exposure apparatus is a scan type exposure apparatus using a step-and-scan system, the integrated amount of exposure can be controlled by controlling the intensity of the exposing light by means of a light-reduction mechanism installed inside the light source part 16. Also the integrated amount of exposure can be controlled by controlling the scanning speed and the width of the area illuminated by the exposing light in the scanning direction, or by a similar controlling means.

In FIG. 1, the reticle R is carried on a reticle stage (not shown in the figures) which is capable of micro-motion in the X-direction, Y-direction and direction of rotation. The position of the reticle stage can be measured with a high degree of precision by means of an externally installed laser interferometer (not shown in the figures). The main controller 50 positions the reticle stage on the basis of the values measured by this laser interferometer. Meanwhile, the wafer W is held by vacuum suction on a wafer holder (not shown in the figures) and this wafer holder is fastened to a wafer stage 1 which can move in the X and Y directions.

A stage system which controls the position of the wafer W in the Z-direction and the angle of inclination of the wafer W is also built into the wafer stage 1. The position of the wafer stage 1 in the X and Y directions is measured with a high degree of precision by means of a moving mirror 8 on the wafer stage 1 and an external laser interferometer 9. The values measured by the laser interferometer 9 are sent to the main controller 50. On the basis of these measured values, the main controller 50 controls the positioning action of the wafer stage 1. A positioning action is performed in which the center of each shot area on the wafer W is moved to the exposure center of the optical projection system 10 by means of the wafer stage 1. An exposure action is then performed and the entire process is repeated. In a step-and-repeat system the positioning action, the pattern on the reticle R is successively transferred to each shot area on the wafer W. Furthermore, a console 14, which has an input device and a display and a memory device 13, which is used to store various parameters are also connected to the main controller 50.

A permanently installed fixed-type illumination sensor 7 consisting of a photodiode is installed on the wafer stage 1 near the wafer W. In the present embodiment, the fixed-type illumination sensor 7 is used as a sensor which measures variation in the intensity of the exposing light IL on the wafer stage 1. There is also a sensor that measures the maximum intensity of the exposing light IL and an illumination quantity monitor that measures the total quantity of illumination of the exposing light IL. The light-receiving surface of the fixed-type illumination sensor 7 is set at substantially the same height as the surface of the wafer W. When the intensity or quantity of illumination inside the exposure field of the optical projection system 10 is to be measured by the fixed-type illumination sensor 7, the light-receiving part of the fixed-type illumination sensor 7 is moved to the desired measurement point by driving the wafer stage 1. The output signal of the fixed-type illumination sensor 7 is sent to the illumination control unit 12 and is subjected to A/D conversion.

Thus, in the present embodiment, an integrator sensor 18 and a fixed-type illumination sensor 7 are provided as permanently installed illumination sensors. Accordingly, when exposure is performed using numerous projection exposure apparatus, it is necessary to calibrate the integrator sensor 18 and fixed-type illumination sensor 7 in each exposure apparatus so that equal amounts of exposure can be set in the respective projection exposure apparatus.

In order to perform such a calibration, a detachable illumination meter 2, which acts as an illumination reference, is installed on the wafer stage 1 so that illumination meter can be detached and removed. Specifically, when the permanently installed illumination sensors are to be calibrated, the operator attaches the detachable illumination meter 2 to the wafer stage 1. In this case, the light-receiving surface of the detachable illumination meter 2 is also set so that this light-receiving surface is at substantially the same height as the surface of the wafer W. Furthermore, the light-receiving part of the detachable illumination meter 2 can be moved in the X and Y directions by driving the wafer stage 1. Additionally, the detachable illumination meter 2 is used in common, among related exposure apparatus, in order to match the intensity of illumination among these exposure apparatus.

When the illumination meter 2 is used in common, the mechanism part of the projection exposure apparatus of the present embodiment is installed inside an air-conditioned chamber 47 and the control parts, such as the illumination control unit 12, main controller 50, and console 14 are installed outside chamber 47. Also, a sensor control device 3 is fastened to the outside surface of the chamber 47 by a magnetic chuck. The detachable illumination meter 2 and the sensor control device 3 are connected via a signal cable 4 which passes through the side wall of the chamber 47.

FIG. 2(a) is an enlarged view which shows the detailed construction of the detachable illumination meter 2. FIG. 2(b) is a plan view of FIG. 2(a). As is shown in FIGS. 2(a) and 2(b), the detachable illumination meter 2 is constructed from a photoelectric transducer 25 and a temperature-regulating element 20 which is mounted on the bottom portion of this photoelectric transducer. The quantity of light entering a circular light-receiving element 19 on the photoelectric transducer 25 is subjected to photoelectric conversion and the photoelectric transducer 25 is cooled by the temperature-regulating element 20 so that the temperature of the photoelectric transducer 25 is kept within permissible limits. Specifically, the temperature-regulating element 20 consists of a cooling element, such as a Peltier element, or similar device, and the surface of the temperature-regulating element 20, that contacts the photoelectric transducer 25, acts as a cooling surface. Any rise in the temperature of the photoelectric transducer 25 that might be caused by the irradiation energy of the exposing light IL is inhibited by the temperature-regulating element 20, so that drift of the sensor characteristics due to temperature fluctuations, such as sensitivity, etc., is lessened.

Power from the sensor control device 3 is respectively supplied to the photoelectric transducer 25 and the temperature-regulating element 20 via the signal cable 4. Furthermore, the output signal of the photoelectric transducer 25 is sent to the sensor control device 3 via signal cable 4. The detachable illumination meter 2 is fastened to the surface of the wafer stage 1 by means of a retainer fitting 21 and a setscrew 22. Accordingly, the detachable illumination meter 2 can easily be removed from the wafer stage 1 merely by removing the retainer fitting 21. As will be described later, a memory part that stores calibration data for the output of illumination sensors, which act as references superior to this detachable illumination meter 2, is also included in the photoelectric transducer part 25.

Returning to FIG. 1, one end of a signal cable 5, which is used to send calibration data and the output signal supplied from the detachable illumination meter, is connected to the sensor control device 3. Connector 6 is attached to the other end of this signal cable 5. Additionally, a connector 11, which corresponds to the connector 6, is attached to the illumination control unit 12. The detachable illumination meter 2 and the illumination control unit 12 are connected via the sensor control device 3 by plugging the connector 6 into the connector II on the side of the illumination control unit 12. After being subjected to A/D conversion inside the sensor control unit 3, the output signal of the detachable illumination meter 2 is input into a signal processing part contained inside the illumination control unit 12 via the signal cable 5, connectors 6 and 11, and an input-output control part (using the GPIB standard or RS232C standard, etc.) built into the illumination control unit 12. In the present embodiment, the signal cables 4 and 5, the sensor control part 3, the connectors 6 and 11, and the input-output control part of the illumination control unit 12 constitute an interface device between the detachable illumination meter 2 and the illumination control unit 12.

As was described above, the respective output signals of the integrator sensor 18 and the fixed-type illumination sensor 7 are also sent to the illumination control unit 12. During the calibration of the permanently installed illumination sensors, prescribed operations are performed by the illumination control unit 12 on the output values of the detachable illumination meter 2, fixed-type illumination sensor 7, and integrator sensor 18 in accordance with commands from the main controller 50. The results of these operations are sent to the main controller 50. On the basis of the data processed by the illumination control unit 12, the main controller 50 calculates parameters for the calibration of the integrator sensor 18 and fixed-type illumination sensor 7. The results of these calculations are stored in the memory device 13 and are output to the console 14, if necessary.

It is also possible to transmit the output of the detachable illumination meter 2 to the illumination control unit 12 by means of a wireless (cordless) system, as shown in FIG. 2(c), instead of using a wire connection.

FIG. 2(c) shows an example in which the output signal of the detachable illumination meter is transmitted by a wireless system. In FIG. 2(c), the detachable illumination meter 2A is equipped with a power supply 23 which has its own storage cell and wireless transmitter, in addition to the photoelectric transducer 25 and temperature-regulating element 20A. The photoelectric transducer 25 and temperature-regulating element 20A are driven using power from the power supply 23. The output signal of the photoelectric transducer 25 is sent by FM waves from an antenna 24 (connected to the wireless transmitter) to the sensor control device 3, which is equipped with a wireless receiver and antenna.

In this case, a magnetic chuck is attached to the bottom part of the temperature-regulating element 20A in order to facilitate installation on the wafer stage 1. Furthermore, the detachable illumination meter 2A can be roughly positioned by pressing the side surface of the temperature-regulating element 20A against a projecting retainer guide 46, which is disposed on the surface of the wafer stage 1. Such a connection of the detachable illumination meter 2A with the sensor control device 3 (and by extension with the illumination control unit 12 in FIG. 1) by means of a cordless system facilitates the attachment and detachment of the detachable illumination meter 2A with respect to the wafer stage 1 inside the chamber 47.

Returning to FIG. 1, an inclined incidence type focal position detection system consisting of a light-transmitting system and a light-receiving system is provided in order to detect the position of the wafer W in the Z-direction (i.e., the focal position of the wafer W) on both sides of the projection optical system 10 (not shown in the figures). Information concerning the focal position of the wafer W is sent to the main controller 50 from this focal position detection system. The main controller 50 drives the wafer stage 1 on the basis of this information, thus controlling the focal position and angle of inclination of the wafer W so that exposure can be performed with the surface of the wafer W caused to coincide with the image plane of the optical projection system 10.

Figure 3A:
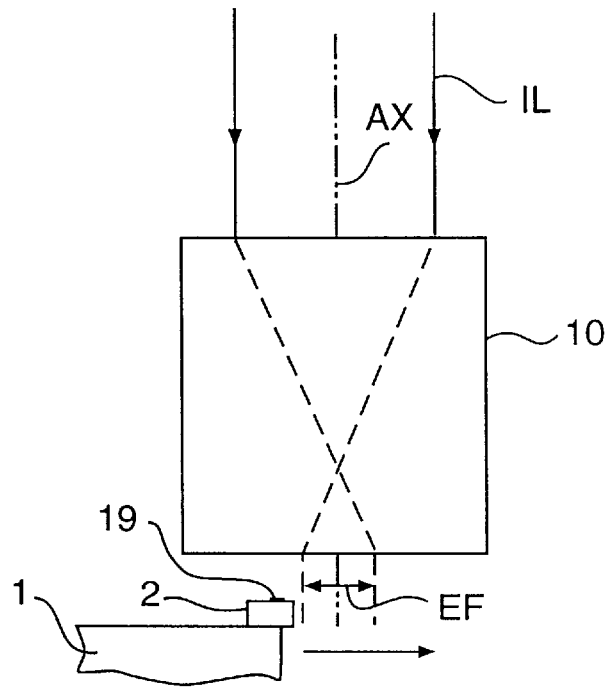
FIG. 3 illustrates the method used to determine the position of the detachable illumination meter 2 shown in FIG. 1.
Figure 3B:
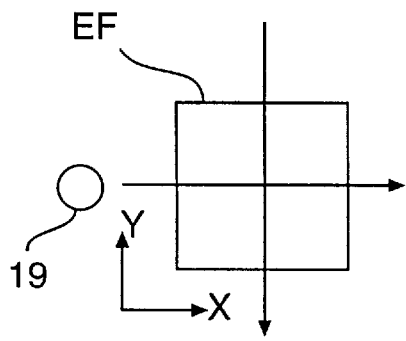

The basic operation of the present embodiment will now be described when the illumination is measured using the detachable illumination meter 2, integrator sensor 18, and fixed-type illumination sensor 7. The detachable illumination meter 2 is used in order to calibrate the outputs of the integrator sensor 18 and fixed-type illumination sensor 7. Accordingly, it is first necessary to make an accurate determination of the position of the detachable illumination meter 2. Measurement of the position of the detachable illumination meter 2 is accomplished as follows:

FIG. 3(a) is a front view which shows the exposure field EF formed on the wafer stage 1 by the optical projection system 10 and FIG. 3(b) is an enlarged plan view showing this exposure field EF. As is shown in FIGS. 3(a) and 3(b), the exposing light IL is projected in a substantially square exposure field EF by the optical projection system 10. While this exposing light IL is being projected, the main controller 50 shown in FIG. 1 drives the wafer stage 1 on the basis of position information from the laser interferometer 9, so that the light-receiving part 19 of the detachable illumination meter 2 is scanned in the X and Y directions with respect to the exposure field EF as shown in FIG. 3(b). Furthermore, the quantity of light entering the light-receiving part 19 of the detachable illumination meter 2, in this case, is sampled at a plurality of prescribed positions via the illumination control unit 12.

Figure 3C:
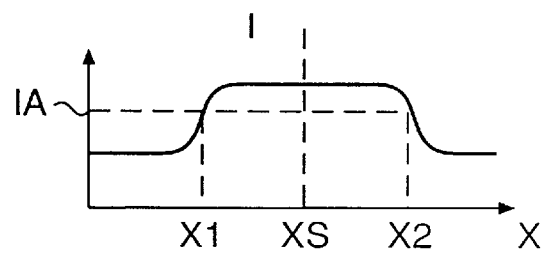

FIG. 3(c) shows the relationship between the X-coordinate of the wafer stage 1 and the sampled output signal I of the detachable illumination meter 2 when the light-receiving part 19 is scanned in the X-direction. Here, the horizontal axis expresses the X-coordinate of the wafer stage 1 and the vertical axis expresses the output signal I. As is shown in FIG. 3(c), the output signal I is large when the light-receiving part 19 is within the exposure field EF, and is small otherwise. Accordingly, by comparing a prescribed slice level IA between the maximum value and minimum value of the output signal I with the output signal I, it is possible to determine the X-coordinates X1 and X2 of the wafer stage 1 when the output signal I cuts across the slice level IA, and further to determine the center coordinate XS between the coordinates X1 and X2. This coordinate XS indicates the coordinate of the wafer stage 1 when the center of the light-receiving part 19 of the detachable illumination meter 2 is positioned at the center of the exposure field EF (i.e., the exposure center) of the optical projection system 10.

In this way, the relative position (in the X-direction) of the detachable illumination meter 2 installed on the wafer stage 1, with respect to the exposure field EF of the optical projection system 10, can be determined. When illumination measurements are performed by the detachable illumination meter 2, auto-focus control is performed by the inclined incidence type focal position detection system so that the image plane of the optical projection system 10 and the surface of the light-receiving part 19 of the detachable illumination meter 2 coincide. Furthermore, instead of using the focal position detection system, it is also be possible to measure the output signal used to determine the relative position in the X-direction (shown in FIG. 3(c)) a multiple number of times with the focal position of the light-receiving part 19 of the detachable illumination meter 2 being varied to calculate the inclination of the sloping parts on both sides. In this case, the light-receiving part 19 of the detachable illumination meter 2 can be made to coincide with the image plane of the optical projection system 10 by determining the focal position where the slope has the greatest inclination. Similarly, the relative position of the detachable illumination meter 2 in the Y-direction, with respect to the exposure field EF, can be determined by scanning the light-receiving part 19 in the Y-direction with respect to the exposure field EF. Also, the relative position of the fixed-type illumination sensor 7 with respect to the exposure field EF can be similarly determined.

The method used to measure illumination by means of the detachable illumination meter 2, integrator sensor 18 and fixed-type illumination sensor 7 will now be described.

FIG. 4 shows the construction of the illumination system 17 and illumination sensors shown in FIG. 1. In the present embodiment, as is shown in FIG. 4, a portion of the exposing light IL separated inside the illumination system 17 is received by the integrator sensor 18. In this case, the light-receiving surface of the integrator sensor 18 is substantially conjugate with the pattern plane of the reticle R and, therefore, with the surface of the wafer W shown in FIG. 1.

Figure 5A:
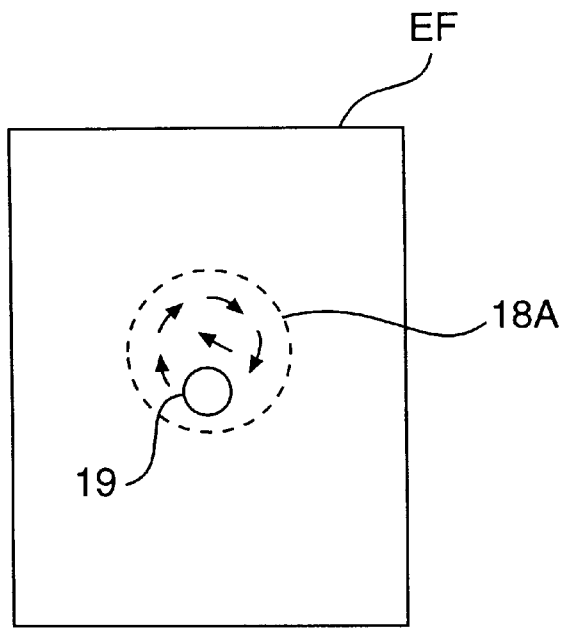
FIG. 5(a) is a plan view which illustrates the method used to measure the intensity within the exposure field by means of the detachable illumination meter 2 shown in FIG. 1.

Because of manufacturing costs and the restricted space available for the installation of optical members, etc., the focusing lens 43 and other parts which transmit light to the integrator sensor 18 are made compact. As a result, the conjugate image 18A formed by the projection of the light-receiving part of the integrator sensor 18 onto the wafer stage 1 is formed with a small area compared to the exposure field EF of the optical projection system 10 (as is shown in FIG. 5(a)). Therefore, the illumination within the range of the conjugate image 18A inside the exposure field EF can be indirectly measured. The center of the conjugate image 18A is set at the center of the exposure field EF (i.e., at the exposure center). However, if manufacturing costs allow, the conjugate image 18A may also be made larger than the exposure field EF. Moreover, it is not absolutely necessary that the light-receiving surface of the integrator sensor 18 be conjugate with the surface of the wafer W. The light-receiving surface may instead be conjugate with the pupil plane of the optical projection system IO (i.e., the optical Fourier transform plane with respect to the reticle R).

FIG. 5(a) shows that the light-receiving part 19 of the detachable illumination meter 2 is formed with an area which is even smaller than that of the conjugate image 18A of the light-receiving part of the integrator sensor 18. In order to calibrate the integrator sensor t8 with a high degree of precision using the detachable illumination meter 2, the wafer stage 1 is driven so that the light-receiving part 19 of the detachable illumination meter 2 is moved to a point inside the exposure field EF of the optical projection system 10 (as shown in FIG. 4). The light receiving part 19 of the detachable illumination meter 2 is then moved around inside the area of the conjugate image 18A, as indicated by the arrows in FIG. 5(a), and the output of the detachable illumination meter 2 is sampled at a multiple number of prescribed positions. The average illumination within the measurement field of the integrator sensor 18 (i.e., the region inside the area of the conjugate image 18A) is then calculated by taking the average of the sampled output values. In synchronization with this measurement of the detachable illumination meter 2, the output of the integrator sensor 18 is also sampled and the mean illumination is calculated. The use of such a measurement method offers advantages in that substantial coincidence of the measurement field of the integrator sensor 18 and the measurement range of the detachable illumination meter 2 can be obtained, and the reliability of calibration is increased.

Such a measurement method is similarly used when of measurements are performed by the fixed-type illumination sensor 7. Specifically, when the illumination is to be measured by the fixed-type illumination sensor 7 (as shown in FIG. 4), the wafer stage 1 is driven so that the light-receiving part 7A of the fixed-type illumination sensor 7 is moved into the exposure field of the optical projection system 10.

Figure 5B:
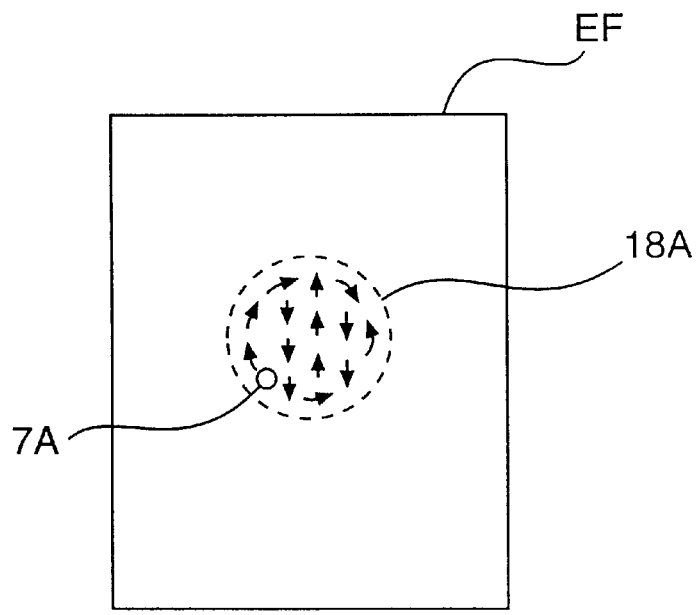
FIG. 5(b) is a plan view which illustrates the method used to measure the intensity within the exposure field by means of the fixed-type illumination sensor 7 shown in FIG. 1.

FIG. 5(b) shows the movement of the light-receiving part 7A of the fixed-type illumination sensor 7 within the exposure field EF. As is shown in FIG. 5(b), the area of the light-receiving part 7A of the fixed-type illumination sensor 7 is even smaller than the area of the light-receiving part 19 of the detachable illumination meter 2 shown in FIG. 5(a). Accordingly, when the correspondence between the output of the integrator sensor 18 and the output of the fixed-type illumination sensor 7 is to be determined, the light-receiving part 7A of the fixed-type illumination sensor 7 is moved in an even finer pattern within the measurement field of the integrator sensor 18 (i.e., within the region of the conjugate image 18A), as shown by the arrows in FIG. 5(b), and the illumination sampling frequency is increased. As a result, the measurement field of the integrator sensor 18 and the measurement range of the fixed-type illumination sensor 7 substantially coincide. Furthermore, if the light-receiving parts of the detachable illumination meter 2 and fixed-type illumination sensor 7 are formed with the same shape and area, illumination measurements can be performed with an even higher degree of precision using the same measurement sequence.

Calibration of the outputs of the integrator sensor 18 and fixed-type illumination sensor 7 is accomplished by altering the intensity of the exposing light IL directed onto the wafer stage 1 in steps. For example, in order to calibrate the integrator sensor 18 the quantity of exposing light IL from the illumination system is first set at the maximum value and the illumination on the wafer stage 1 is measured. Specifically, in FIG. 4, the fourth aperture diaphragm 52D (shown in FIG. 6(a)), which has the maximum aperture, is positioned at the emission surface of the fly-eye lens 31 and the aperture of the variable field diaphragm 28 is set at the maximum value.

Accordingly, the outputs of the integrator sensor 18 and detachable illumination meter 2 are simultaneously detected at the maximum coherence factor (σ value). The σ value is next altered in a stepwise manner and the illumination is similarly measured by the integrator sensor 18 and detachable illumination meter 2. In recent photolithographic techniques, there has been a tendency to use small-σ illumination in which illumination is performed at a small σ value using the sixth aperture diaphragm 52F, as shown in FIG. 6(a), or annular band illumination using an annular band-form aperture diaphragm such as the third aperture diaphragm 52C, as shown in FIG. 6(a). The calibration results may vary as a result of such changes in the illumination conditions. Accordingly, a similar calibration must be performed when the illumination conditions are changed.

FIGS. 6(b) and 6(c) show the respective conditions of the exposing light on the reticle R in the case of small-σ illumination and ordinary illumination conditions. The aperture half-angle θ' of the exposing light IL in the case of small-σ illumination is small compared to the aperture half-angle $θ_2$ of the exposing light IL in the case of ordinary illumination conditions. Generally, the sensitivity of illumination sensors themselves varies according to the angle of incidence of the light beam. By using a sensor which shows little variation in sensitivity, as the light-receiving part 19 of the detachable illumination meter 2, and using a sensor which displays little drift in sensor, the characteristics caused by temperature or irradiation changes with the exposing light as the integrator sensor 18. Thus, it is possible to improve the precision of calibration and to extend the intervals at which calibration is performed.

An example of the method used to calibrate the outputs of the integrator sensor 18 and fixed-type illumination sensor 7 using the detachable illumination meter 2 in the projection exposure apparatus of the present embodiment will now be described. First, the operator attaches the detachable illumination meter 2 to the wafer stage 1 shown in FIG. 1, and connects the signal cable 5 of the sensor control device 3 on the outside surface of the chamber 47 to the illumination control unit 12. An illumination calibration program, which has been preprogrammed in the main controller 50, is then executed. When the illumination calibration program is started up, exposing light IL is emitted from the light source part 16 under the control of the main controller 50 via the light source control unit 15. The relative position of the light-receiving part 19 of the detachable illumination meter 2, with respect to the exposure field EF of the optical projection system 10, is measured by the method described with reference to FIG. 3.

On the basis of these measurement results, the center of the light-receiving part 19 of the detachable illumination meter 2 is positioned at the exposure center of the optical projection system 10.

In a stepper-type projection exposure apparatus, such as that of the present embodiment, exposing light IL with a fixed intensity is used and the amount of exposure is controlled by using the opening and closing of the shutter in the light source part 16 to control the exposure time on the wafer W. After the center of the light-receiving part 19 of the detachable illumination meter 2 has been positioned at the exposure center of the optical projection system 10, the shutter in the light source part 16 is opened and the quantity of light entering the integrator sensor 18 is continuously monitored. The shutter is then closed so that the integrated quantity of light (integrated amount of exposure) QI obtained by integrating the quantity of light equals a prescribed value. The illumination from the opening of the shutter to the closing of the shutter is then measured by the integrator sensor 18 and the detachable illumination meter 2. The value measured by the integrator sensor 18 is sent directly to the illumination control unit 12 and the illumination value measured by the detachable illumination sensor 2 is sent to the illumination control unit 12 via the sensor control device 3. In the illumination control unit 12, the integrated light quantity from the integrator sensor 18 and the integrated intensity value QS from the detachable illumination meter 2 are determined. Here, the integrated light quantity QI from the integrator sensor 18 and the integrated intensity value QS from the detachable illumination meter 2 thus determined are designated as $C_1$ and $A_1$, respectively. While the integrated amount of exposure is varied within the exposable range, the illumination is simultaneously detected by the integrator sensor 18 and the detachable illumination meter 2 and the respective integrated light quantities $C_i$ (i=2, 3, . . . , n) and integrated intensity values $A_i$ are calculated and sent to the main controller 50. In this detection of illumination, the light-receiving part 19 of the detachable illumination meter 2 may be moved around inside the conjugate image 18A of the light-receiving part of the integrator sensor 18, as described with reference to FIG. 5.

Figure 7A:
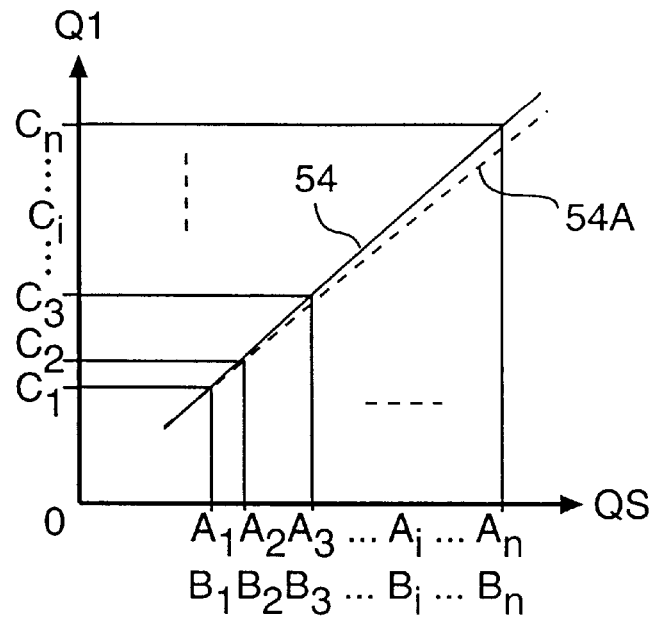
FIG. 7(a) is an explanatory diagram which illustrates the method used to calculate calibration parameters in a stepper-type projection exposure apparatus.

FIG. 7(a) depicts the relationship between the integrated light quantity QI obtained from the integrator sensor 18 and the integrated intensity value QS obtained from the detachable illumination meter 2. As is shown by the solid straight line 54 in FIG. 7(a), the relationship between the measured values $C_1$, $C_2$, . . . , $C_n$ of the integrated light quantity QI from the integrator sensor 18 and the measured values $A_1$, $A_2$, . . . , $A_n$ of the integrated intensity value QS from the detachable illumination meter 2 is linear and substantially free of any offset. In the main controller 50, the mean value P1 of the ratio of the output of the detachable illumination meter 2 to the output of the integrator sensor 18 (hereafter referred to as the "calibration parameter for the integrator sensor 18") is determined using the following equation:

$$P1=(A_1/C_1+A_2/C_2+A_3/C_3+ \ldots +A_n/C_n)/n \qquad (1)$$

The calibration parameter for the fixed-type illumination sensor 7 is determined using the calibrated integrator sensor 18 as a reference illumination sensor. Specifically, the center of the light-receiving part of the fixed-type illumination sensor 7 is moved to the exposure center of the optical projection system 10 and the quantities of light incident on the integrator sensor 18 and fixed-type illumination sensor 7 are continuously monitored, as in the case of the detachable illumination meter 2. In this case as well, the light-receiving part of the fixed-type illumination sensor 7 may be positioned within the area of the conjugate image of the light-receiving part of the integrator sensor 18. Here, if the values of the integrated light quantity QI measured by the integrator sensor 18 are designated as $C_i$ (i=1, 2, . . . , n) and the corresponding values of the integrated intensity QS measured by the fixed-type illumination sensor 7 are designated as $B_i$, a linear relationship, which is substantially free of any offset (as indicated by the broken line 54A in FIG. 7(a)), is also obtained between the integrated light quantity values C$i$ and the integrated intensity values $B_i$. In the main controller 50, the mean value P2 of the ratio of the output of the fixed-type illumination sensor 7 to the output of the integrator sensor 18 in this case (hereafter referred to as the "calibration parameter for the fixed-type illumination sensor 7") is determined by using the following equation:

$$P2=(B_1/C_1+B_2/C_2+B_3/C_3+ \ldots +B_n/C_n)/n \qquad (2)$$

Thus, in the case of a stepper-type projection exposure apparatus, in which the intensity of the exposing light is constant, the calibration parameters P1 and P2 can easily be determined and stored in the memory device 13. Calibration is then performed by multiplying the values actually measured by the integrator sensor 18 and fixed-type illumination sensor 7 by the stored calibration parameters P1 and P2, respectively. In this way the illumination which would be measured by the detachable illumination meter 2 is derived by multiplying the values measured at the integrator sensor 18 by the calibration parameter P1. Similarly, the illumination which would be measured by the integrator sensor 18 is derived by multiplying the values measured at the fixed-type illumination sensor 7 by the calibration parameter P2. Furthermore, the product P1·P2 of the two calibration parameters P1 and P2 may be newly used as a calibration parameter for the fixed-type illumination sensor 7. By multiplying the values measured by the fixed-type illumination sensor 7 by the calibration parameter P1·P2, it is possible to determine the illumination if measurements were performed on the wafer stage 1 using the detachable illumination meter 2.

Furthermore, when the calibration parameter P1 is determined in the present embodiment, the output signal of the detachable illumination meter 2 is sent directly to the illumination control unit 12 via the sensor control device 3 and the signal cable 5, and the output signal of the integrator sensor 18 is also sent directly to the illumination control unit 12. Since the output signals of the integrator sensor 18 and detachable illumination meter 2 can be input with the same timing, the ratio of the outputs of the two sensors, i.e., the calibration parameter P1, can be accurately determined even if the output of the exposing light IL from the light source part 16 varies over time as a result of fluctuations in the arc of the mercury lamp, or similar type fluctuations. This results in the calibration of the integrator sensor 18 being performed with a high degree of precision. When the calibration parameter P1·P2 is used, the fixed-type illumination sensor 7 can be calibrated with a high degree of precision with respect to the detachable illumination meter 2. In the present embodiment the values measured by the detachable illumination meter 2, integrator sensor 18, and fixed-type illumination sensor 7 are input in common by the illumination control unit 12. Therefore, the processing of Equation (1) and Equation (2), can be performed at a high speed.

Although the projection exposure apparatus of the present embodiment is a stepper-type apparatus, the method used to calibrate the outputs of the integrator sensor 18 and fixed-type illumination sensor 7, using the detachable illumination meter 2 when the projection exposure apparatus shown in FIG. 1 is a scan-exposure type apparatus, such as a step-and-scan type apparatus, will now be described.

In a scan-exposure type projection exposure apparatus, exposing light IL from the light source part 16 is directed onto a slit-form illumination area on the reticle R during exposure. While the pattern within this slit-form illumination area on the reticle R is projected onto the wafer W via the optical projection system 10, the reticle R and wafer W are synchronously scanned with respect to the optical projection system, so that the pattern image of the reticle R is successively transferred to the shot area on the wafer W that is the object of exposure. Thus, in a scan-exposure type apparatus, exposure is performed continuously. Instead of the integrated quantity of light of the output value of the integrator sensor 18 being monitored, the intensity of the exposing light measured by the integrator sensor 18 is continuously monitored in order to ascertain whether this intensity is within a permissible range relative to a prescribed target value. In this case, where E is the sensitivity (appropriate amount of exposure) of the photoresist on the wafer W, V is the scanning velocity of the wafer stage 1, L is the width in the scanning direction (slit width) of the exposure area formed by projecting the slit-form illumination area onto the wafer W, and S is the intensity of the exposing light IL on the wafer W, the following relationship is established:

$$E/S = L/V \quad (3)$$

In order to avoid a drop in the throughput of the exposure process, it is desirable that the wafer W be scanned at as high a scanning velocity as possible. Accordingly, the scanning velocity V is ordinarily set in the vicinity of the maximum velocity. Moreover, if the slit width L is set in the vicinity of the maximum width, the right side of equation (3) becomes more or less fixed. Thus, when the sensitivity E of the photoresist varies according to the layer, on the wafer, it is necessary to vary the intensity S of the exposing light IL in accordance with the sensitivity E in order to satisfy Equation (3). Such a variation of the intensity S is accomplished as follows. A light reduction mechanism which allows the stepwise variation of the exposing light (and continuous variation within a prescribed range) is installed inside the light source part 16, or a variable power supply which controls the driving power of the exposure light source in the light source part 16 is provided and this light reduction mechanism or variable power supply is used in order to vary the intensity S. In such configurations, there is a danger that the relationship of the output of the integrator sensor 18 to the output of the detachable illumination meter 2 may show a slight variation.

Thus, in a scan-exposure type projection exposure apparatus, the intensity of the exposing light IL is measured by the integrator sensor 18 and detachable illumination meter 2 while the intensity S of the illuminating light IL is varied by means of the light reduction mechanism or variable power supply. In this case, the values of the illuminating light IL intensity LI measured by the integrator sensor 18 are designated as $c_i$ (i=1, 2, 3, ..., n). Furthermore, the values of the intensity LS simultaneously measured by the detachable illumination meter 2 are designated as $a_i$.

Figure 7B:
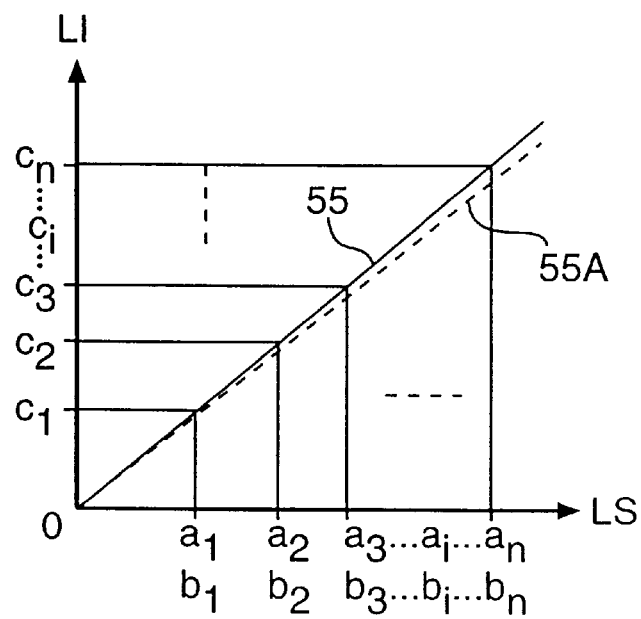
FIG. 7(b) is an explanatory diagram which illustrates the method used to calculate calibration parameters in a scan exposure type projection exposure apparatus.

FIG. 7(b) shows the relationship between the intensity LS measured by the detachable illumination meter 2 and the intensity LI measured by the integrator sensor 18. In cases where the linearity of the relationship between the intensity LS and the intensity LI is good, the relationship between the measured values $c_1, c_2, \ldots, c_n$ of the intensity LI obtained by the integrator sensor 18 and the measured values $a_1, a_2, \ldots, a_n$ of the intensity LS obtained by the detachable illumination meter 2 is a straight line which is substantially free of any offset, as indicated by the solid straight line 55 in FIG. 7(b). In this case, the mean value of the ratios $a_i/c_i$ of the measured intensity values can be used as a calibration parameter. However, in cases where the linearity of the relationship between the two sets of intensity values is poor, the error in the measurement of the intensity is large if a single calibration parameter P1 is determined, as in a stepper-type projection exposure apparatus, and calibration is performed on the basis of this parameter.

Accordingly, in cases where the linearity of the relationship between the two sets of intensity values is poor, in a scan-exposure type apparatus, the values of the ratios of the measured values $a_1$ of the intensity LS obtained by the detachable illumination meter 2 to the measured values $c_1$ of the intensity LI obtained by the integrator sensor 18, i.e., $a_1/c_1, a_2/c_2, a_3/c_3, \ldots, a_n/c_n$, are calculated and the values $a_i/c_i$ thus obtained are approximated by a curve. For example, the values $a_i/c_i$ thus obtained are approximated by an m-order (m is an integer of 2 or greater) function f(LI) for the intensity LI (measured by the integrator sensor 18) in the main controller 50, using the least squares method or similar method. Coefficients of respective orders are determined for this function f(LI) and are stored in the memory device 13 as calibration parameters. As a result, the intensity LS measured by the detachable illumination meter 2 can be expressed by the following equation:

$$LS = f(LI) \cdot LI \quad (4)$$

Afterward, an intensity which is converted into the intensity LS measured on the wafer stage 1 using the detachable illumination meter 2 can be obtained by multiplying the intensity LI measured by the integrator sensor 18 during exposure by the function f(LI).

Also, instead of using a curve approximation as described above, it is also possible to store the obtained values of the intensity ratios $a_i/c_i$ as a table for the intensity LI. For example, the value of the ratio LS/LI can be calculated by means of a proportional distribution among the measured values $c_i$ to $c_{i+1}$, of the intensity measured by the integrator sensor 18, and the output of the integrator sensor 18 can be calibrated using this value.

Moreover, in the case of a scan-exposure type apparatus as well, the calibration parameter for the fixed-type illumination sensor 7 can be determined using the calibrated integrator sensor 18. Specifically, when the measured values $c_i$ of the intensity LI (measured by the integrator sensor 18 while varying the intensity of the exposing light), and the corresponding measured values bi of the intensity (indicated as LS') (measured by the fixed-type illumination sensor 7), are used a linear relationship which is substantially free of any offset (as indicated by the broken-line curve 55A in FIG. 7(b)) is also obtained between the measured values $c_i$ and $b_i$, if the linearity of the two sets of values is good. Accordingly, the mean value of the ratios $c_i/b_i$ of the measured values can be used as a calibration parameter. However, if the linearity of the two sets of values is poor, then the values $c_i/b_i$ may be approximated by a higher-order function g(LS') of the intensity LS' measured by the fixed-type illumination sensor 7. These values also may be tabulated.

By calculating calibration parameters as described above, it is possible to calibrate the outputs of the integrator sensor 18 and detachable illumination meter 2 with a high degree of precision in a scan-exposure type apparatus as well. Since the output signals of the integrator sensor 18 and detachable illumination meter 2 can be input with the same timing, the calibration parameters can be accurately determined. Thus, the calibration of the integrator sensor 18 and, therefore, the calibration of the fixed-type illumination sensor 7 can be performed with a high degree of precision.

Similarly, in a stepper-type projection exposure apparatus, when the intensity of the exposing light is altered, the relationship between the output of the integrator sensor 18 and the output of the detachable illumination meter 2 can be approximated by a second-order or higher order function, and the coefficients for the respective orders of this function can be stored as calibration parameters. The same is true in regard to the fixed-type illumination sensor 7.

Figure 8:
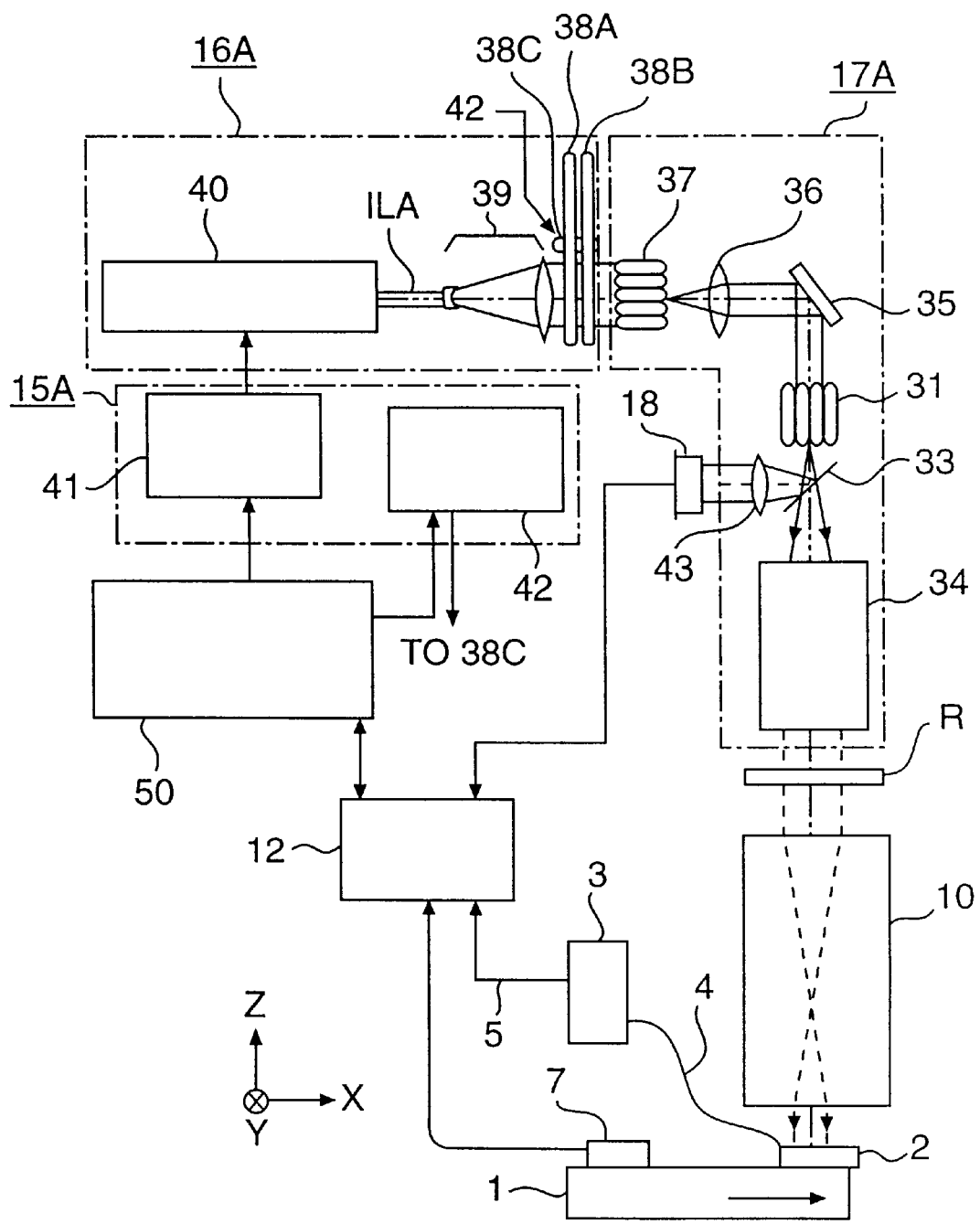
FIG. 8 is a schematic structural diagram which illustrates a second embodiment of the projection exposure apparatus of the present invention.

A second embodiment of the present invention will now be described with reference to FIGS. 8 and 9. In this embodiment, the present invention is applied to a stepper-type projection exposure apparatus which uses a pulsed light source as the exposure light source. In FIG. 8, parts that correspond to parts shown in FIGS. 1 and 4 are labeled with the same symbols and a description of these parts is omitted.

FIG. 8 is a schematic structural diagram that illustrates the projection exposure apparatus of this embodiment. In the light source part 16A shown in FIG. 8, an excimer laser light source 40 consisting of an ArF excimer laser light source, KrF excimer laser light source or similar light source, is used as a pulsed-emission type exposure light source. The light-emitting operation of the excimer laser light source 40 is controlled by the main controller 50 via a laser control device 41 inside the light source control unit 15A. The timing of the pulsed emission of the excimer laser light source 40, the oscillation frequency, and the output are precisely controlled by the main controller 50.

The exposing light ILA, which is laser light emitted by the excimer laser light source 40, passes through a beam expander 39 and a pair of variable ND filters 38A, 38B in which ND filter plates of various transmissivities are arranged around the peripheries of the filters. The light reduction rate with respect to the exposing light ILA can be altered in multiple steps by adjusting the ND filter combination of the variable ND filters 38A, 38B via a driving part 38C. The apparatus is constructed so that the operation of the driving part 38C can be controlled by the main controller 50 via a light reduction part control system 42 contained in the light source control unit 15A. The exposing light ILA, which has passed through the variable ND filters 38A, 38B enters an illumination system 17A. This light passes through a first fly-eye lens 37, a relay lens 36, a vibrating mirror 35 used for spectral removal, and a second fly-eye lens 31, and enters a beam splitter 33.

A portion of the exposing light ILA separated by the beam splitter 33 enters an integrator sensor 18 via a focusing lens 43. Meanwhile, the exposing light ILA, which passes through the beam splitter 33, passes through an optical system 34 containing a variable-field diaphragm and condenser lens, and illuminates the reticle R. During the measurement of illumination, the exposing light ILA passing through the reticle R passes through an optical projection system 10 and enters a detachable illumination meter 2 attached to the surface of the wafer stage 1. The output of the detachable illumination meter 2 is sent on-line to the illumination control unit 12 via signal lines 4 and 5, the sensor control unit 3 and connectors (not shown in the figures). A fixed-type illumination sensor 7 is also fastened to the wafer stage 1, and the outputs of the integrator sensor 18 and fixed-type illumination sensor 7 are sent to the illumination control unit 12. The remaining construction of this apparatus is similar to that of the projection exposure apparatus shown in FIG. 1.

In the present embodiment, the illumination intensity per pulse (pulse energy) of the excimer laser light source is unstable. Therefore, during exposure at respective points on the wafer, the wafer is irradiated with tens of pulses of the exposing light and the uniformity of illumination is maintained by an averaging effect. Specifically, in the projection exposure apparatus shown in FIG. 8 a minimum number of pulses of exposing light ILA for each point on the wafer is determined. For example, when (a) the oscillation frequency of the excimer laser light source 40 is 500 Hz, (b) the random variation of the illumination intensity from pulse to pulse is 5%, and (c) the number of exposing pulses is 50 pulses the variation in the integrated amount of exposure on the wafer following a 50-pulse exposure is approximately 0.7%, and the exposure time is 0.1 seconds.

Furthermore, in the present embodiment, the intensity of the exposing light ILA can be altered in a stepwise manner by adjusting the combination of the variable ND filters 38A, 38B used as light reduction parts. The output of the excimer laser light source 40 can be continuously altered to some extent via the laser control device 41. Accordingly, in a stepper-type projection exposure apparatus using a pulsed light source as in the present embodiment, the amount of exposure is not controlled by means of a shutter, but instead a method is devised in which pulsed emission of the excimer laser light source 40 is performed for a prescribed period of time only. The intensity of the exposing light ILA is continuously varied in order to control the integrated amount of exposure on the wafer. The following relationship is obtained where E is the sensitivity of the photoresist on the wafer, p is the amount of energy per pulse of the exposing light ILA on the wafer, and n is the number of exposing pulses:

$$E = np \tag{5}$$

Therefore, when the sensitivity E of the photoresist varies, the quantity of light is varied in a stepwise manner by adjusting the combination of transmissivities of the variable ND filters 38A, 38B, and the output of the excimer laser light source 40 is precisely adjusted by means of the laser control device 41, so that the energy per pulse p of the exposing light ILA is continuously controlled. During exposure, this energy per pulse p is measured by the integrator sensor 18, and the excimer laser light source 40 and variable ND filters 38A and 38B are controlled on the basis of these measurement results.

The method used to calibrate the output of the integrator sensor 18 by means of the detachable illumination meter 2 in the present embodiment will now be described. First, the light-receiving part of the detachable illumination meter 2 is moved to a point within the area of the conjugate image of the light-receiving part of the integrator sensor 18, and the energy per pulse p is set at an arbitrary value and then the pulsed emission of the excimer laser light source 40 is started.

Figure 9A:
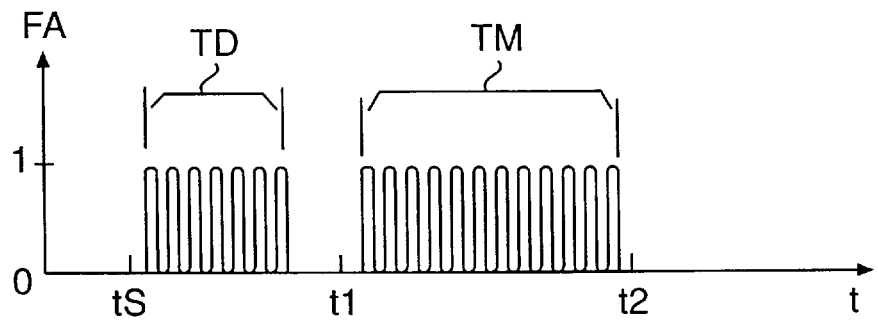
FIGS. 9(a), 9(b) and 9(c) disclose a diagram which shows the timing of the pulsed emission when the excimer laser light source shown in FIG. 8 is used having the measurement timing of the integrator sensor.

FIG. 9(a) shows the timing of the pulsed emission in the excimer laser light source 40. The horizontal axis indicates time t and the vertical axis indicates a flag FA which has a high level of "1" during the emission of each pulse. As is shown in FIG. 9(a), pulsed emission is first performed as a dummy emission (with no measurement being performed) for a prescribed time interval TD following the instant in time tS. Then, pulsed emission consisting of n pulses for the purpose of measurement is performed during a measurement time interval TM between times t1 and t2.

Figure 9B:
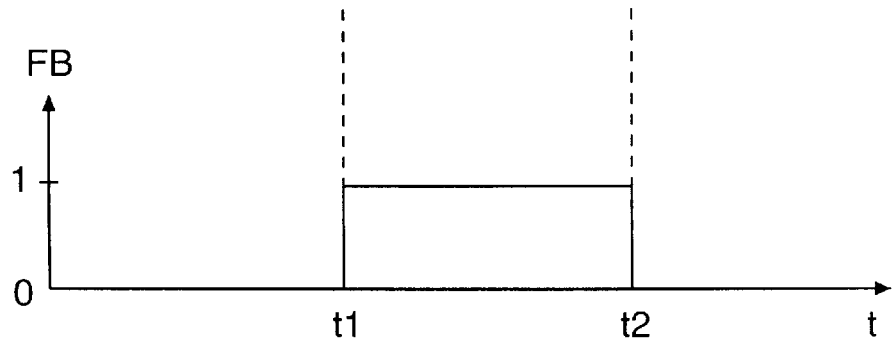
Figure 9C:
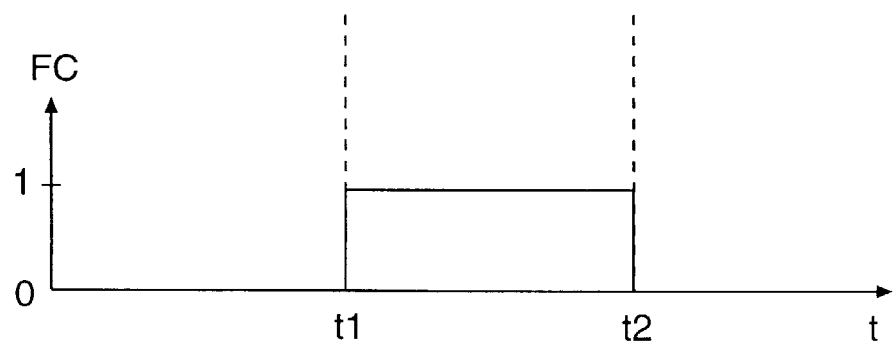

FIG. 9(b) shows a flag FB that has a high level of "1" only during time intervals in which measurements are being performed by the integrator sensor 18. FIG. 9(c) shows a flag FC that has a high level of "1" only during time intervals in which measurements are being performed by the detachable illumination meter 2. As is shown by the flags FB and FC, measurements are performed simultaneously by the integrator sensor 18 and detachable illumination meter 2 between the times t1 and t2. In this embodiment, in the illumination control unit 12, the peak hold value of the output of the integrator sensor 18 is input for each pulse emission and, in the sensor control device 3, the peak hold value of the output of the detachable illumination meter 2 for each pulse emission is subjected to A/D conversion and sent to the illumination control unit 12. For convenience, the values measured in this way are also referred to as the "intensity for each light pulse".

The intensities for respective pulses measured by the integrator sensor 18 and detachable illumination meter 2 are respectively designated as $d_i$ and $e_i$ (i=1, 2, 3, . . . , n). If the relationship between the intensity values $d_i$ and $e_i$ is close to linear, a fixed calibration parameter can be determined and stored using the method indicated by Equation (1) above. On the other hand, in cases where the relationship between the intensity values $d_i$ and $e_i$ is non-linear, this relationship between the intensity values $d_i$ and $e_i$ is determined in the form of a second-order or higher order function by a method such as the method of least squares, and this function is stored as a calibration parameter. Alternatively, the relationship between the intensity values $d_i$ and $e_i$ may also be stored as a table.

The calibration parameter for the fixed-type illumination sensor 7 is determined using the calibrated integrator sensor as a reference illumination sensor. Specifically, the light-receiving part of the fixed-type illumination sensor 7 is moved to a point within the area of the conjugate image of the light-receiving part of the integrator sensor 18. The excimer laser light source 40 performs pulsed emission, as in the case of the detachable illumination meter 2, and simultaneously the intensity of illumination is measured by the integrator sensor 18 and fixed-type illumination sensor 7. The respective intensity values measured by the integrator sensor 18 and fixed-type illumination sensor 7 here are designated as $d_i$ and $f_i$ (i=1, 2, 3, . . . , n). If the relationship between the intensity values $d_i$ and $f_i$ is close to linear, a fixed calibration parameter can be determined using the method indicated by Equation (2) above. On the other hand, when the relationship between the intensity values $d_i$ and $f_i$ is non-linear, this relationship between the intensity values $d_i$ and $f_i$ is determined in the form of a function or table. During actual exposure, calibrated intensities are detected by multiplying the values measured by the integrator sensor 18 and fixed-type illumination sensor 7 by the respective calibration parameters thus determined.

In the present embodiment as well, since the output of the detachable illumination meter 2 is sent on-line to the illumination control unit 12, the calibration of the integrator sensor 18 and fixed-type illumination sensor 7 relative to the detachable illumination meter 2 can be performed with a high degree of precision even if the output of the exposing light ILA from the light source part 16A fluctuates over time. Furthermore, since the measurement values obtained by the detachable illumination meter 2 and integrator sensor 18 are input into the illumination control unit 12 in common, the processing, which is used to determine the calibration parameters, can be performed at a high speed.

An example of the control method used to control the detachable illumination meter 2 used in the working configuration will now be described with reference to FIGS. 10 and 11. The detachable illumination meter 2, shown in FIG. 1, is used as a reference illumination sensor for a plurality of exposure apparatus (e.g., 10 apparatus) that are to be matched. In other words, an operation is repeated in which the detachable illumination meter 2 is attached to an exposure apparatus, which requires intensity calibration, is then removed from this exposure apparatus following the completion of the intensity calibration, and used for the calibration of other exposure apparatus. In the projection exposure apparatus, shown in FIG. 1, in which the intensity has been calibrated by means of the detachable illumination meter 2, the integrator sensor 18 itself of the projection exposure apparatus subsequently acts as a reference illumination meter.

However, since the integrator sensor 18 is constantly illuminated by the exposing light, the sensitivity characteristics of the integrator sensor 18 vary over time. For example, if the sensitivity characteristics are stable and show no drift for a period of approximately 3 to 6 months, the integrator sensor 18 can be used "as is" as a reference illumination sensor during this period. However, if a longer period of time has elapsed, it is desirable to re-calibrate the integrator sensor 18 by means of an illumination sensor acting as a reference (reference illumination sensor) which has been appropriately stored and maintained, such as the detachable illumination meter 2.

In this case, control of the illumination intensity using a single reference illumination sensor becomes physically difficult when the number of exposure apparatus to be matched is large. Moreover, there is also a danger that the reference illumination sensor may malfunction.

Accordingly, a control system with a hierarchical structure is desirable. The structure is equipped with a plurality of reference illumination sensors, e.g., 1 to 3 reference illumination sensors used as parent devices), a plurality of child devices that are respectively calibrated by each of the parent devices, and a plurality of grandchild devices that are respectively calibrated by each of the child devices.

Figure 10A:
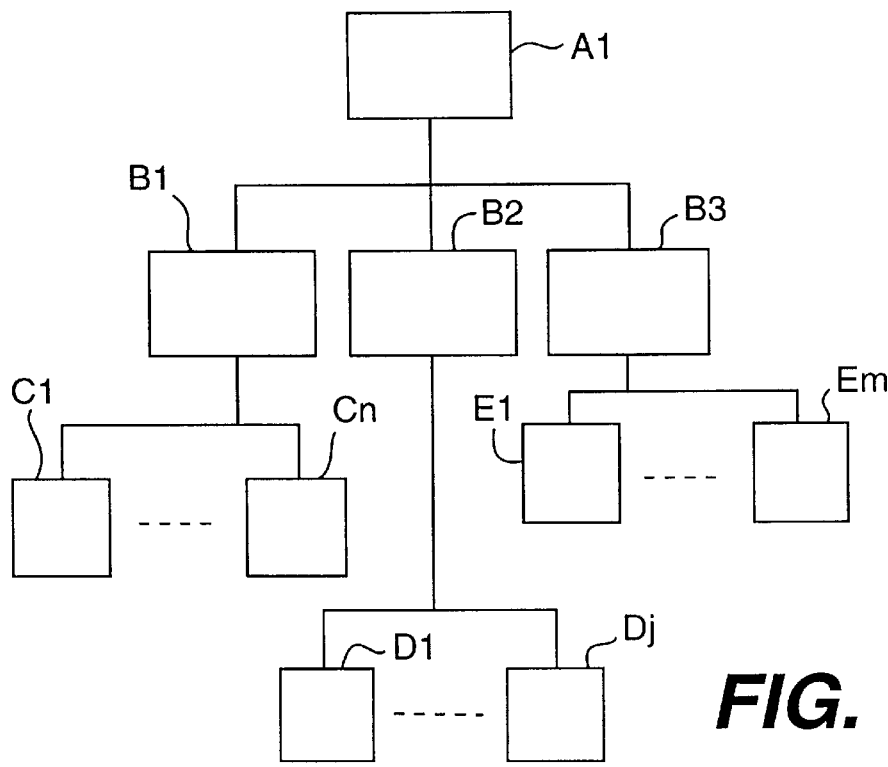
FIG. 10(a) illustrates a hierarchical structure used for the control of reference illumination sensors in an embodiment of the present invention.

FIG. 10(a) shows one example of such a reference illumination sensor control system. In FIG. 10(a), three child devices B1 through B3 are calibrated using a single parent device A1, and a plurality of grandchild devices C1 through Cn, D1 through Dj and E1 through Em are respectively calibrated using each of the child devices B1 through B3. Reference illumination sensors similar to the detachable illumination meter 2, shown in FIG. 1, are used as the parent device A1, child devices B1 through B3 and grandchild devices C1 through Cn, etc. The illumination sensors of numerous exposure apparatus can be appropriately calibrated by using such a reference illumination sensor control system. Since the parent device A1 acts as a reference for all of the reference illumination sensors, it is desirable that this parent device A1 consist of a sensor which is superior in terms of stability and linearity of sensitivity characteristics with respect to the amount of incident light. Furthermore, when the outputs of the child devices B1 through B3 are calibrated relative to the parent device A1, the intensity of the exposing light is actually alternately measured by the parent device A1 and child devices B1 through B3, or the exposing light is split into separate beams and the intensity is simultaneously measured by the parent device A1 and child devices B1 through B3. Then, the ratios of the measured values are determined.

Figure 10B:
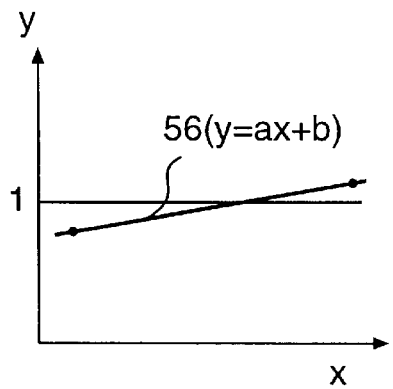
FIG. 10(b) depicts a linear function used for calibration among the reference illumination sensors in FIG. 10(a).

FIG. 10(b) illustrates a case in which the linearity between the values measured by the parent device A1 and the values measured by the child devices B1 through B3 is good. In FIG. 10(b), the horizontal axis indicates the quantity (intensity) x of the exposing light incident on the reference illumination sensors and the vertical axis indicates the ratio of the values measured by the child devices B1 through B3 to the values measured by the parent device A1, i.e., the measurement ratio y. In this case, as is shown by the straight line 56, the quantity of light x and the measurement ratio y can be expressed as a first-order function (y=ax+b) using the coefficients a and b. Accordingly, memory parts storing the coefficients a and b may be installed in the child devices B1 through B3. During the actual measurement of illumination these coefficients a and b may be sent to the sensor control device 3, as shown in FIG. 1, so that the values measured by the child devices B1 through B3 are calibrated by the sensor control device 3.

Figure 10C:
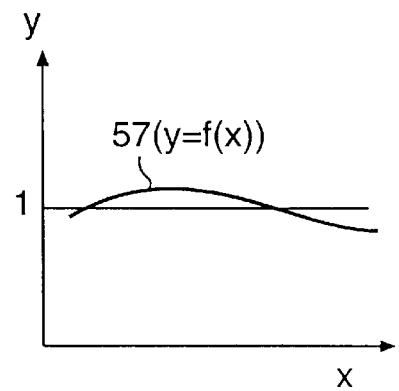
FIG. 10(c) depicts a non-linear function used for calibration among the reference illumination sensors in FIG. 10(a).

When the relationship between the values measured by the parent device A1 and the values measured by the child devices B1 through B3 is non-linear, the relationship of the measurement ratio y to the light quantity x can be expressed by a higher-order function (y=f(x)), as shown by the curve 57 in FIG. 10(c). In this case, the coefficients of the function f(x) may be stored in the memory parts of the child devices B1 through B3, or data indicating the relationship between the light quantity x and the measurement ratio y may be stored in the memory parts in tabular form so that calibration can be performed during actual illumination measurements. The operation illustrated in FIG. 7(b) may also be used to determine the measurement ratio y in this way.

When the outputs of the grandchild devices C1 through Cn are calibrated relative to the child device B1, as shown in FIG. 10(a), the measurement ratio between the respective devices is determined and coefficients or functions indicating this measurement ratio are stored in the memory parts of the grandchild devices C1 through Cn. In the same manner, the outputs of the respectively corresponding subordinate grandchild devices are calibrated relative to the other child devices B2 and B3.

The method used to achieve calibration among the reference illumination sensors will now be described. For example, a case will now be described in which the output of the detachable illumination meter 2 as shown in FIG. 1 is calibrated with respect to the parent device A1. Two calibration methods are possible. The first is a method in which the intensity values of two reference illumination sensors are measured in the position of the integrator sensor 18. The second method is one in which the intensity values of two reference illumination sensors are measured on the wafer stage 1. Accordingly, in each case, a special calibration jig is used which accommodates two reference illumination sensors and which is equipped with a beam splitter that splits the exposing light into two parts.

Figure 11A:
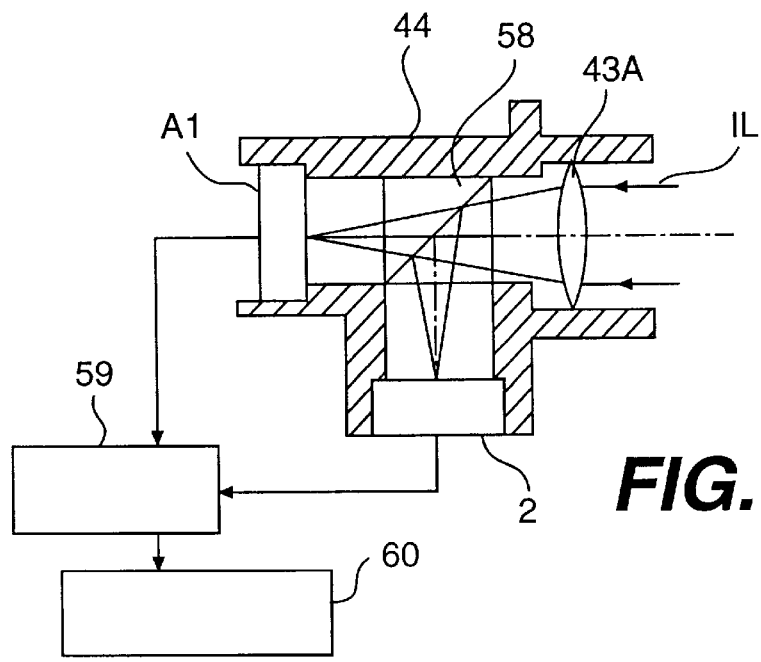
FIG. 11(a) depicts one example of a calibration jig used to calibrate reference illumination sensors in an embodiment of the present invention.

FIG. 11(a) shows a sectional view of the calibration jig 44 which is used to measure the intensity by means of two reference illumination sensors in the position of the integrator sensor 18 shown in FIG. 4. When calibration is to be performed, the integrator sensor 18 and focusing lens 43, as shown in FIG. 4, are removed and the calibration jig 44 is installed instead. The exposing light separated by the beam splitter 33 inside the illumination system 17, as shown in FIG. 4, enters the beam splitter 58 via the focusing lens 43A inside the calibration jig 44, as shown in FIG. 11(a). This incident exposing light IL is split into two light beams by the beam splitter 58. Inside the calibration jig 44, a parent device A1 and a detachable illumination meter 2 are fastened in place so that these sensors respectively face the two emission surfaces of the beam splitter 58. Accordingly, the light beam that passes through the beam splitter 58 enters the parent device A1, and the light beam that is reflected by the beam splitter 58 enters the detachable illumination meter 2. The output signals from the parent device A1 and the detachable illumination meter 2 are sent to a signal processing system 59. In this signal processing system 59, the ratio of the intensity values measured by the detachable illumination meter 2 to the intensity values measured by the parent device A1 (i.e., the calibration parameter), or a function or table indicating this ratio, is determined by a method similar to that described above with reference to FIG. 7(b). The calibration parameter or function thus determined is sent to a host computer 60 and is stored. Additionally, the same data is also stored in the memory part of the detachable illumination meter 2.

Figure 11B:
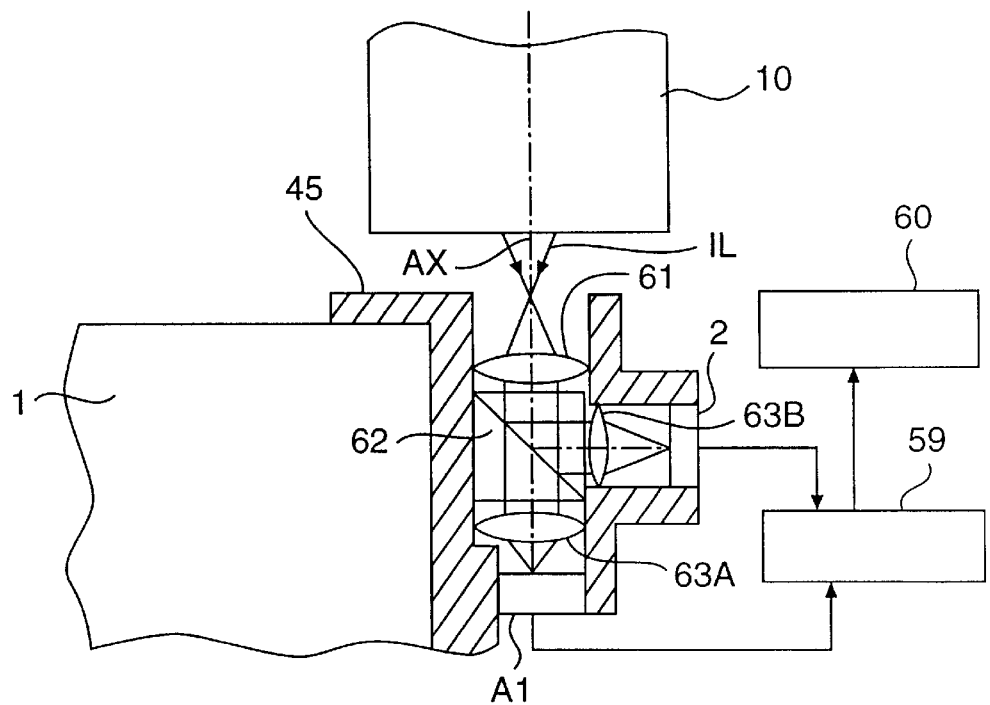
FIG. 11(b) shows another example of such a calibration jig.
Figure 12:
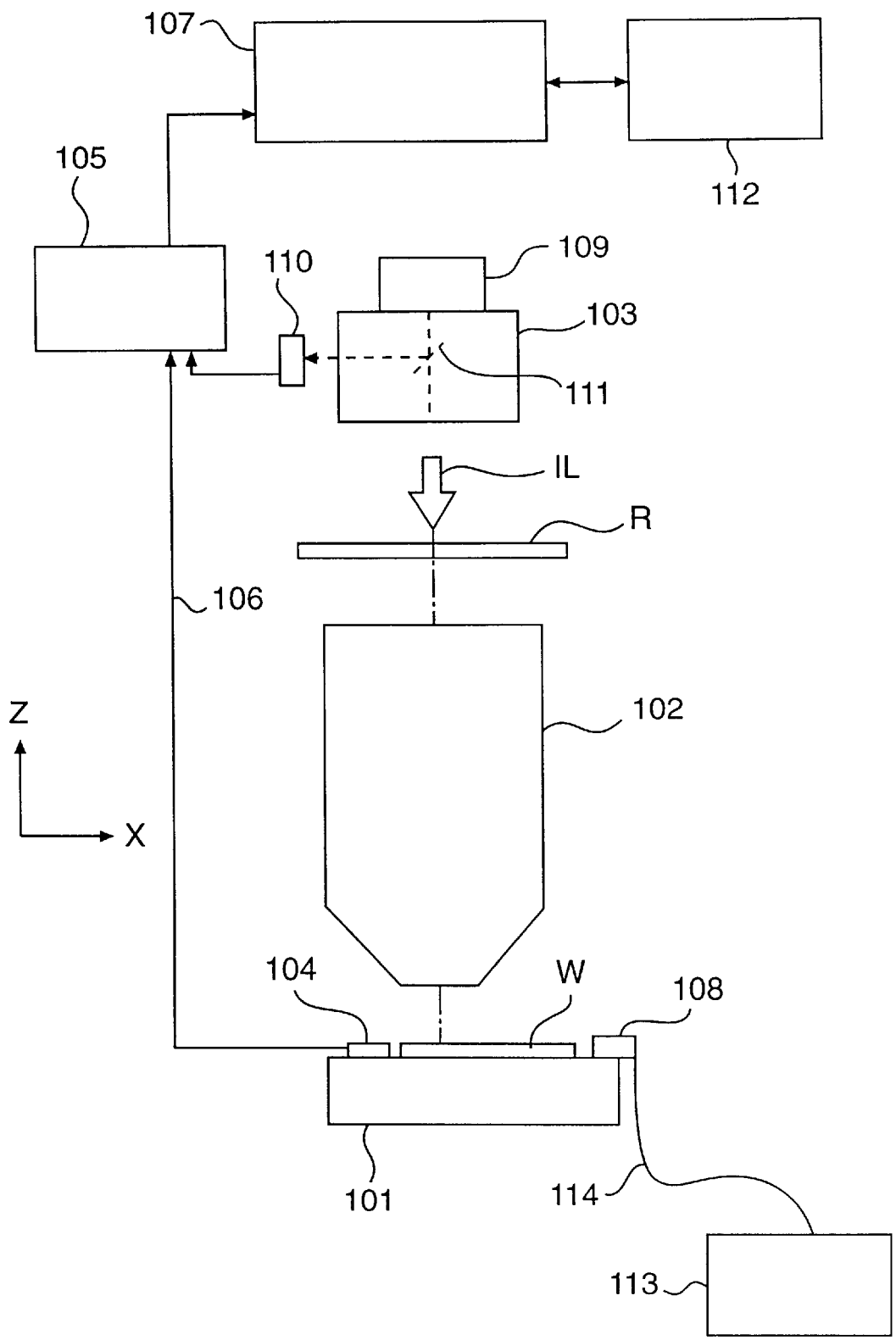
FIG. 12 is a schematic structural diagram which illustrates a projection exposure apparatus equipped with conventional illumination sensors.

FIG. 11(b) shows a sectional view of a calibration jig 45 which is used to calibrate the detachable illumination meter 2 by means of a parent device A1 on the surface of the wafer stage 1. As is shown in FIG. 11(b), the calibration member 45 is fastened to the outer edge portion of the upper surface of the wafer stage 1. A relay lens 61, which converts the exposing light IL from the optical projection system 10 into parallel light, a beam splitter 62, and relay lenses 63A and 63B, which focus the light beams from the beam splitter 62, are installed inside the calibration jig 45. A parent device A1 and detachable illumination meter 2 are fastened in place so that these sensors respectively face the relay lenses 63A and 63B. During calibration, the wafer stage 1 is driven so that the optical axes of the relay lenses 61 and 63A coincide with the exposure center of the optical projection system 10.

The exposing light IL from the optical projection system 10 passes through the relay lens 61 and enters the beam splitter 62 as parallel light. This light is split into two light beams by the beam splitter 62. The light beam which passes through the beam splitter 62 enters the parent device A1 via the relay lens 63A, while the light beam which is reflected by the beam splitter 62 enters the detachable illumination meter 2 via the relay lens 63B. The output signals from the parent device A1 and the detachable illumination meter 2 are sent to the signal processing system 59. In this signal processing system 59, the calibration parameter for the detachable illumination meter 2 or a function used for calibration is determined by the same method as that described with reference to FIG. 7. The correction parameter or function thus determined is stored in the host computer 60 and is also stored in the memory part of the detachable illumination meter 2.

Illumination intensity matching among the respective exposure apparatus can be accomplished by means of reference illumination sensors calibrated by the method described above. Here, in order to achieve a matching precision of 1.4% or better, the measurement characteristics of the detachable illumination meter 2 and integrator sensor 18 are set so that the following conditions relating to permissible values are satisfied:

A. Detachable Illumination Meter 2
   (a) Measurement reproducibility: ±0.07 (%) (sum of squares)
   (b) Measurement linearity (after software correction): ±0.07 (%) (simple sum)
   (c) Difference in angular characteristics between devices: ±0.1 (%) (simple sum)
   (d) Stability (total irradiation time: 24 hours): ±0.25 (%) (simple sum)

B. Integrator Sensor 18
   (a) Measurement reproducibility: ±0.05 (%) (sum of squares)
   (b) Measurement linearity (after software correction): ±0.05 (%) (simple sum)
   (c) Difference in angular characteristics between devices: ±0.1 (%) (simple sum)
   (d) Stability (total irradiation time: 24 hours): ±0.25 (%) (simple sum)

Among the above conditions, the "measurement linearity" indicates the linearity of the output with respect to the amount of incident light, and the "difference in angular characteristics between devices" indicates the scatter in the output variation in cases where the spreading angle (coherence factor) of the exposing light is different. The calibration of the integrator sensor 18 and fixed-type illumination sensor 7 in each exposure apparatus using a detachable illumination meter 2, such as that described above, is performed each time that the exposure light source (mercury lamp, etc.) is replaced. The time required for measurement is 0.2 hours, the number of exposure apparatus that can be handled using a single detachable illumination meter 2 is 20, and the calibration interval for the detachable illumination meter 2 itself is 6 months.

For example, when the matching precision MS (among the respective exposure apparatus) of the intensity measured by the integrator sensor 18 in the present embodiment is calculated, the measurement errors for two devices, i.e., the parent device and the child device, are superimposed when where a detachable illumination meter 2 used as a reference constitutes the child device B1 in FIG. 10(a). Accordingly, from the above measurement characteristics, this matching precision MS is as follows:

$$MS = (0.07^2 \times 2 + 0.05^2)^{1/2} + 0.07 \times 2 + 0.05 + 0.1 \times 3 + 0.25 \times 3 \approx 1.35 \ (\%)$$

Thus, the value of the matching precision MS is within the permissible range of 1.4%, so that the intensity of illumination can be measured with a high matching precision.

The respective illumination sensors described above, including the parent device, are not sensors that are used to measure the absolute quantity of light. Instead, these are sensors that measure a relative light quantity, with the parent device being viewed as the highest-ranking standard, i.e., the illumination measured by the parent device being viewed as a type of absolute light quantity. Control based on absolute light quantities is desirable, however, in cases where the i line of a mercury lamp is used as the exposing light, the illumination brightness is high, and the formation of parallel light rays is difficult. Accordingly, absolute light quantity control is difficult to achieve using current technology. The difference in angular characteristics between devices is described among the measurement characteristics. The reasons that a small difference in angular characteristics between devices is required are as indicated below.

The error arising from the angular characteristics of illumination sensors, such as the detachable illumination meter 2 and integrator sensor 18, includes two types of errors. The first type of error is an error that is generated (in principle) in proportion to the cosine (cos) of the angle of incidence in accordance with Lambert's law when the illumination field is larger than the light-receiving field of the illumination sensor. When the light-receiving surface of the illumination sensor is in the imaging position, this error does not present a problem. However, when the light-receiving surface is defocused, this error appears as undesirable scattering of the light. This error will be referred to as "error arising from the light-receiving field characteristics."

The second type of error is an error that is generated in the coating, on the detection surface of the illumination sensor, and arises from changes in sensitivity depending on the angle of incidence of the exposing light. This error will be referred to as "error arising from the angular characteristics of the detector."

Thus, when where the angular characteristics differ as a result of differences in the individual illumination sensors, i.e., when there is a difference in angular characteristics between devices, the relative light quantities cannot be accurately compared if the angle of incidence of the exposing light varies as a result of modified illumination. However, in the setting of the appropriate amount of exposure (dose), the characteristics of the photoresist also have a major effect. Since the dose is set separately for cases of ordinary illumination and cases of modified illumination, absolute angular characteristics are not required in regard to the integrator sensor. On the other hand, when intensity matching is performed for a plurality of exposure apparatus, such a difference in angular characteristics between devices is a major cause of measurement error. Accordingly, it is necessary to minimize the differences in the angular characteristics of the detachable illumination meter 2 and integrator sensor 18 between individual devices. In view of the above points, the value of the difference in angular characteristics between devices is set in accordance with the strictest illumination conditions that can be envisioned, i.e., the use of annular-band illumination. The use of an annular-band diaphragm with a light blocking part which is ⅔ the size of the outer diameter of the aperture is used as the aperture diaphragm in the illumination system.

In the case of the fixed-type illumination sensor 7, for example, non-uniformity in the relative intensity within the exposure field is measured. Accordingly, in cases where there are differences in the a value (aperture number) depending on the image height, such differences in the a value cannot be detected if the error arising from the angular characteristics is large. As a result, line width error is generated. On the other hand, in cases where the error arising from the angular characteristics of the detector is small, all of the line width error can be handled as differences in the σ value.

In the working configurations described above, the reference illumination sensors were discussed separately for stepper-type exposure apparatus and scan exposure type projection exposure apparatus. However, even when the same type of exposure light source is used, it may be necessary to perform matching among exposure apparatus using different systems. Accordingly, the detachable illumination meter 2 is designed so that this meter can handle both of the calibration methods shown in FIGS. 7(a) and 7(b), thus allowing the matching of both stepper-type exposure apparatus and scan exposure type exposure apparatus. In this case, since the shape of the exposure field varies according to the exposure apparatus involved, it is desirable to generalize the shape of the light-receiving part of the detachable illumination meter 2 so that this shape is common to both types of exposure apparatus, or to construct the detachable illumination meter 2 so that the light-receiving part (probe part) can be replaced.

Thus, in the working configurations described above, a plurality of reference illumination sensors (detachable illumination meters 2) are controlled in a hierarchical structure as parent devices, child devices and grandchild devices, and except for the parent device, all of the reference illumination sensors store a calibration parameter or calibration relationship that is related to a higher-ranking reference illumination sensor. Accordingly, the subordinate reference illumination sensors all measure relative intensity values using one parent device as a reference; as a result, the matching precision of the measured intensity values among the respective exposure apparatus can be improved, even when where numerous exposure apparatus are used. Furthermore, even if a certain reference illumination sensor should malfunction, this sensor can be replaced by other reference illumination sensors.

In the working configurations described above, each detachable illumination meter 2 was attached to (and detached from) the wafer stage 1 by the operator. However, it is also possible to install a conveying apparatus that conveys each detachable illumination meter 2, and to position the corresponding wafer stage 1 in each case so that the detachable illumination meter 2 is moved to the exposure center of the optical projection system, and whereby the illumination intensity is measured. Furthermore, it is also possible to use a construction in which the detachable illumination meter 2 is positioned between the optical projection system 10 and the wafer W by a slider that is used to convey the wafer. In such methods, there is no need for the operator to enter the chamber 47; accordingly, the calibration of the illumination sensors can be performed more quickly.

It will be apparent to those skilled in the art that various modifications and variations can be made in the exposure apparatus of the present invention without departing from the spirit or scope of the invention. It is intended that the present invention cover the modifications and variations of this invention provided they come within the scope and spirit of the appended claims and their equivalents.

What is claimed is:

1. An exposure apparatus including a substrate stage for positioning a substrate and transferring a pattern formed on a mask onto the substrate by illuminating the pattern with an illuminating light through an illuminating system, the exposure apparatus comprising:

a first illumination sensor adapted to be attachable and detachable to the substrate stage and capable of measuring an intensity of illumination of the illuminating light on the substrate stage;

an interface device capable of transferring input measurement data from the first illumination sensor;

a second illumination sensor capable of measuring the intensity of illumination of at least a part of the illuminating light; and an illumination control unit coupled to, and capable of receiving data from the first illumination sensor via an interface device on-line and the second illumination sensor, and obtaining a relationship between the measurement data from the first illumination sensor and the second illumination sensor.

2. The exposure apparatus according to claim 1, wherein the second illumination sensor is an indirect-type sensor capable of measuring the intensity of illumination of the illuminating light on the substrate stage by detecting the intensity of illumination of a light beam that is separated from the illuminating light; and the illumination control unit that receives measurement data from the second illumination sensor in synchronization with the input of measurement data from the first illumination sensor via the interface device.

3. The exposure apparatus according to claim 2, wherein the illuminating light used for exposure is emitted as pulses.

4. The exposure apparatus according to claim 3, wherein the illumination control unit receives the measurement data from the first illumination sensor via the interface device and the second illumination sensor in synchronization with the pulsed emission of the illuminating light.

5. The exposure apparatus according to claim 4, wherein the interface device supplies measurement data from the first illumination sensor to the illumination control unit through a cordless system.

6. The exposure apparatus according to claim 5, further comprising:

a memory that stores correction values for an output of the first illumination sensor relative to an output of the second illumination sensor, wherein the second illumination sensor acts as a prescribed reference.

7. The exposure apparatus according to claim 3, wherein the interface device supplies measurement data from the first illumination sensor to the illumination control unit through a cordless system.

8. The exposure apparatus according to claim 7, further comprising:

a memory that stores correction values for an output of the first illumination sensor relative to an output of the second illumination sensor, wherein the second illumination sensor acts as a prescribed reference.

9. The exposure apparatus according to claim 1, wherein the illuminating light used for exposure is emitted as pulses.

10. The exposure apparatus according to claim 9, wherein the illumination control unit receives the measurement data from the first illumination sensor and the second illumination sensor via the interface device in synchronization with the pulsed emission of the illuminating light.

11. The exposure apparatus according to claim 10, wherein the interface device supplies measurement data from the first illumination sensor to the illumination control unit through a cordless system.

12. The exposure apparatus according to claim 11, further comprising:

a memory that stores correction values for an output of the first illumination sensor relative to an output the second illumination sensor, wherein the second illumination sensor acts as a prescribed reference.

13. The exposure apparatus according to claim 9, wherein the interface device supplies measurement data from the first illumination sensor to the illumination control unit through a cordless system.

14. The exposure apparatus according to claim 13, further comprising:
a memory that stores correction values for an output of the first illumination sensor relative to an output the second illumination sensor, wherein the second illumination sensor acts as a prescribed reference.

15. The exposure apparatus according to claim 9, further comprising:
a memory that stores correction values for an output of the first illumination sensor relative to an output of the second illumination sensor, wherein the second illumination sensor acts as a prescribed reference.

16. The exposure apparatus according to claim 1, wherein the interface device supplies measurement data from the first illumination sensor to an illumination control unit through a cordless system.

17. The exposure apparatus according to claim 1, further comprising:
a memory that stores correction values for an output of the first illumination sensor relative to an output of the second illumination sensor, wherein the second illumination sensor acts as a prescribed reference.

18. The exposure apparatus according to claim 1, wherein the substrate stage has an adapting device which adapts the first illumination sensor.

19. The exposure apparatus according to claim 1, wherein the substrate stage positions the first illumination sensor in the illuminating area of the illuminating light when the illumination control unit receives the data from the first illumination sensor via the interface device.

20. The exposure apparatus according to claim 1, further comprising a third illumination sensor mounted on the substrate stage and which is different from the first illumination sensor.

21. An exposure apparatus including a substrate stage for positioning a photosensitive substrate and transferring a pattern formed on a mask onto the photosensitive substrate by exposing the pattern in the presence of an illuminating light, the exposure apparatus comprising:
permanently installed illumination sensors that directly or indirectly measure an intensity of illumination of the illuminating light on the substrate stage;
a first illumination sensor capable of being detached from the substrate stage and capable of measuring the intensity of illumination of the illuminating light on the substrate stage;
a second illumination sensor capable of being detached from the substrate stage and capable of measuring the intensity of illumination of the illuminating light on the substrate stage;
a memory that stores correction values for the output of the first detachable illumination sensor relative to the output of a second detachable illumination sensor that acts as a prescribed reference; and
a calibrator that calibrates an output of each of the permanently installed and first illumination sensor.

22. An exposure apparatus including a substrate stage for positioning a photosensitive substrate and transferring a pattern formed on a mask onto the photosensitive substrate by exposing the pattern in the presence of an illuminating light, the exposure apparatus comprising:

a permanently installed illumination sensor that measures an intensity of illumination of the illuminating light on the substrate stage;
a first detachable illumination sensor attachable to and detachable from the substrate stage, and capable of measuring the intensity of illumination of the illuminating light on the substrate stage in order to calibrate an output of the illumination sensor;
a second detachable illumination sensor that acts as a reference for the output of the first detachable illumination sensor;
an optical splitting system capable of splitting the illuminating light used for exposure on the substrate stage and capable of conducting the split light to the first and second detachable illumination sensors; and
a signal processing device capable of comparing generally parallel outputs from the first and second detachable illumination sensors.

23. An exposure apparatus that exposes a substrate by transferring a pattern of a mask on the substrate with exposure light, the exposure apparatus comprising:
a fixed-type sensor affixed to he exposure apparatus;
an adapting device which adapts a reference sensor detachable from the adapting device;
an interface device in communication with the reference sensor attached to the adapting device capable of receiving an output from the reference sensor; and
a controller in communication with each of the interface device and the fixed-type sensor which is capable of receiving an output from the fixed-type sensor and capable of receiving the output from the reference sensor by way of the interface device.

24. The exposure apparatus according to claim 23, wherein the controller obtains a relationship between the output of the fixed-type sensor and the output of the reference sensor.

25. The exposure apparatus according to claim 24, further comprising a memory in communication with the controller, wherein the memory stores the relationship between the fixed-type sensor and the reference sensor.

26. The exposure apparatus according to claim 23, wherein the controller receives the output of the fixed-type sensor in synchronization with a measurement of the reference sensor.

27. The exposure apparatus according to claim 23, wherein the adapting device is disposed on a substrate stage that holds the substrate.

28. The exposure apparatus according to claim 27, wherein the substrate stage positions the reference sensor in the exposing area of the exposure light when the controller receives the output from the reference sensor via the interface device.

29. The exposure apparatus according to claim 27, further comprising an exposure light sensor, mounted on the substrate stage, which is different from the reference sensor.

30. A method of calibrating a fixed-type sensor affixed to an exposure apparatus having a stage, the method comprising the steps of:
obtaining an output of a reference sensor adapted to be attachable and detachable to an exposure apparatus and capable of being used among a plurality of exposure apparatus; and
obtaining a measurement of an output of the fixed-type sensor based on the same timing relationship with the obtaining an output of a reference sensor.

31. The method according to claim 30, further including the step of determining a relationship between the output of the fixed-type sensor and the output of the reference sensor.

32. The method according to claim 31, further comprising the step of storing the relationship determined between the fixed-type sensor and the reference sensor.

33. The method according to claim 30, wherein the steps of obtaining the output of the reference sensor and obtaining the output of the fixed-type sensor are done in synchronization.

34. The method according to claim 30, wherein the step of obtaining the output of the reference sensor is performed by an on-line interface device.

35. The method according to claim 30, wherein the reference sensor includes a first reference sensor and a second reference senor.

36. The method according to claim 35, further comprising the steps of:
   obtaining a relationship between an output of the first sensor and an output of the second sensor; and
   obtaining the measurement of the output of the fixed-type sensor based on a timing relationship between the fixed-type sensor and the taking of a measurement of the second reference sensor.

37. The method according to claim 36, wherein the second reference sensor further includes a plurality of reference sensors, and wherein each of the plurality of reference sensors is capable of being attached or detached from the exposure apparatus.

38. The method according to claim 30, further comprising the steps of:
   adapting the reference sensor on a substrate stage which is disposed in the exposure apparatus and holding the substrate; and
   positioning the reference sensor in an exposing area of the exposure apparatus by moving the substrate stage.

39. A method of calibrating a sensor affixed to a plurality of exposure apparatuses, the method comprising the steps of:
   obtaining an output of each reference sensor in each of a plurality of apparatuses;
   obtaining a relationship between the output of each of the plurality of reference sensors, adapted to be attachable and detachable to a plurality of exposure apparatuses, and a calibration sensor; and
   obtaining an output of each sensor affixed to each of the plurality of exposure apparatuses in a timing relationship between each of the plurality of sensors and each of the plurality of reference sensors.

40. The method of calibrating a sensor affixed to a plurality of exposure apparatuses according to claim 39, further comprising the step of:
   obtaining a relationship between each of the plurality of reference sensors and each of the outputs of the plurality of sensors.

41. The method of calibrating a sensor affixed to a plurality of exposure apparatuses according to claim 40, further comprising the steps of:
   storing each of the relationships obtained between each of the plurality of reference sensors and each of the outputs of the plurality of sensors; and
   storing each of the relationships between the output of each of the plurality of reference sensors the calibration sensor.

42. The method of calibrating a sensor affixed to a plurality of exposure apparatuses according to claim 39, wherein the step of obtaining the output of each of the plurality of sensors is performed in synchronization with the measurement of each of the plurality of reference sensors.

43. An exposure method utilized in an exposure apparatus for exposing a substrate by transferring a pattern of a mask on the substrate with an illumination flux, the exposure method comprising the steps of:
   obtaining an output of a reference sensor adapted to be attachable and detachable to an exposure apparatus and capable of being used among a plurality of exposure apparatus;
   obtaining a measurement of an output of a fixed-type sensor affixed to the exposure apparatus in the same timing relationship with the obtaining an output of the reference sensor.

44. The exposure method according to claim 43, further comprising the step of:
   adjusting an exposure energy on a substrate based on the relationship obtained between the fixed-type sensor and the reference sensor, wherein the fixed-type sensor directly or indirectly measures an intensity of an illumination flux on the substrate.

45. The exposure method according to claim 43, wherein the measurement of the output of the fixed-type sensor is obtained in synchronization with the measurement of the reference sensor.

46. The exposure method according to claim 43, wherein the step of obtaining the output of the reference sensor is performed by an interface device.

47. The exposure method according to claim 43, wherein the reference sensor further includes a first reference sensor and a second reference.

48. The exposure method according to claim 47, further comprising the steps of:
   obtaining a relationship between an output of the first reference sensor and an output of the second reference sensor; and
   obtaining of the measurement of the output of the fixed-type sensor in the same timing relationship with the obtaining output of the second reference sensor.

49. The exposure method according to claim 48, wherein the second reference sensor includes a plurality of reference sensors each attachable and detachable to the exposure apparatus.

50. The method according to claim 43, further comprising the steps of:
   adapting the reference sensor on a substrate stage which is disposed in the exposure apparatus and holding the substrate; and
   positioning the reference sensor in an exposing area of the illumination flux by moving the substrate stage.

51. A method for manufacturing a semiconductor element by utilizing an exposure apparatus for exposing a substrate by transferring a pattern of a mask on the substrate with an illumination flux, comprising the steps of:
   obtaining an output of a fixed-type sensor affixed to the exposure apparatus;
   obtaining an output of a reference sensor adapted to be attahcable and detachable to the exposure apparatus;
   obtaining a relationship between the output of the fixed-type sensor and the output of the reference sensor in the same timing relationship with the obtaining the output of the fixed-type sensor; and
   adjusting an exposure energy on the substrate based on the relationship between the output of the fixed-type sensor and the output of the reference sensor.

52. A lithography system having a plurality of exposure apparatuses, the lithography system comprising:

a plurality of sensors affixed to each of a plurality of exposure apparatuses;

a reference sensor adapted to be attachable and detachable to each of the plurality of exposure apparatuses;

a plurality of calibration sensors, wherein the number of the calibration sensors is less than or equal to the number of the reference sensors;

a storage device which stores a relationship determined between an output of the reference sensor and an output of the calibration sensor;

an interface device adapted to be in communication with each of the plurality of exposure apparatuses, wherein the interface device obtains the output from the reference sensor; and a controller in communication with the sensor and in communication with the reference sensor, by way of the interface device, which receives inputs from the sensor and the reference sensor.

53. The lithography system according to claim 52, wherein the reference sensor has a storage device.

54. The lithography system according to claim 52, wherein the reference sensor has a first reference sensor and a second reference sensor and the memory device stores a relationship determined between the output of the first reference sensor and the second reference sensor.

55. The lithography system according to claim 54, wherein the memory device stores the determined relationship by a hierarchial structure.

* * * * *

UNITED STATES PATENT AND TRADEMARK OFFICE
CERTIFICATE OF CORRECTION

PATENT NO. : 6,115,107
DATED : September 5, 2000
INVENTOR(S) : Nishi

It is certified that error appears in the above-identified patent and that said Letters Patent is hereby corrected as shown below:

Claim 12, line 4, after "output", insert --of--.

Claim 14, line 4, after "output", insert --of--.

Claim 51, line 8, change "attahcable" to --attachable--.

Signed and Sealed this

Fifteenth Day of May, 2001

NICHOLAS P. GODICI

Attest:

Attesting Officer

Acting Director of the United States Patent and Trademark Office